United States Patent
Honda et al.

(10) Patent No.: US 10,669,454 B2
(45) Date of Patent: Jun. 2, 2020

(54) METHOD FOR MANUFACTURING SEMICONDUCTOR DEVICE INCLUDING HEATING AND PRESSURING A LAMINATE HAVING AN ADHESIVE LAYER

(71) Applicant: HITACHI CHEMICAL COMPANY, LTD., Tokyo (JP)

(72) Inventors: Kazutaka Honda, Tokyo (JP); Koichi Chabana, Tokyo (JP); Keishi Ono, Tokyo (JP); Akira Nagai, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/770,792

(22) PCT Filed: Oct. 26, 2016

(86) PCT No.: PCT/JP2016/081774
§ 371 (c)(1),
(2) Date: Apr. 25, 2018

(87) PCT Pub. No.: WO2017/073630
PCT Pub. Date: May 4, 2017

(65) Prior Publication Data
US 2018/0312731 A1    Nov. 1, 2018

(30) Foreign Application Priority Data

Oct. 29, 2015  (JP) .................................. 2015-212990
Mar. 8, 2016  (JP) .................................. 2016-044788
Jun. 9, 2016  (JP) .................................. 2016-115355

(51) Int. Cl.
*H01L 25/065*    (2006.01)
*C09J 163/00*    (2006.01)
(Continued)

(52) U.S. Cl.
CPC ............. *C09J 11/06* (2013.01); *C09J 163/00* (2013.01); *C09J 201/00* (2013.01); *H01L 24/10* (2013.01);
(Continued)

(58) Field of Classification Search
CPC ....... C09J 163/00; C09J 11/06; H01L 21/447; H01L 2021/6015; H01L 2021/603; H01L 2224/81201; H01L 2224/81203
See application file for complete search history.

(56) References Cited

U.S. PATENT DOCUMENTS

2003/0159773 A1* 8/2003 Tomiyama ............. C09J 163/00
156/248
2006/0292823 A1* 12/2006 Ramanathan ..... H01L 21/76801
438/455
(Continued)

FOREIGN PATENT DOCUMENTS

JP    H2-280349 A    11/1990
JP    H03-171643 A    7/1991
(Continued)

*Primary Examiner* — Allen L Parker
*Assistant Examiner* — Gustavo G Ramallo
(74) *Attorney, Agent, or Firm* — Fitch, Even, Tabin & Flannery, LLP

(57) ABSTRACT

Disclosed is a method for manufacturing a semiconductor device which includes: a semiconductor chip; a substrate and/or another semiconductor chip; and an adhesive layer interposed therebetween. This method comprises the steps of: heating and pressuring a laminate having: the semiconductor chip; the substrate; the another semiconductor chip or a semiconductor wafer; and the adhesive layer by interposing the laminate with pressing members for temporary press-bonding to thereby temporarily press-bond the substrate and the another semiconductor chip or the semiconductor wafer to the semiconductor chip; and heating and pressuring the laminate by interposing the laminate with (Continued)

pressing members for main press-bonding, which are separately prepared from the pressing members for temporary press-bonding, to thereby electrically connect a connection portion of the semiconductor chip and a connection portion of the substrate or the another semiconductor chip.

11 Claims, 8 Drawing Sheets

(51) Int. Cl.
*C09J 11/06* (2006.01)
*C09J 201/00* (2006.01)
*H01L 25/07* (2006.01)
*H01L 25/18* (2006.01)
*H01L 23/00* (2006.01)
*C09J 11/04* (2006.01)

(52) U.S. Cl.
CPC .............. *H01L 24/75* (2013.01); *H01L 24/81* (2013.01); *H01L 24/83* (2013.01); *H01L 24/92* (2013.01); *H01L 25/0657* (2013.01); *H01L 25/07* (2013.01); *H01L 25/18* (2013.01); *C09J 11/04* (2013.01); *H01L 24/05* (2013.01); *H01L 24/13* (2013.01); *H01L 24/16* (2013.01); *H01L 24/29* (2013.01); *H01L 24/32* (2013.01); *H01L 2224/0401* (2013.01); *H01L 2224/05009* (2013.01); *H01L 2224/16146* (2013.01); *H01L 2224/16237* (2013.01); *H01L 2224/16238* (2013.01); *H01L 2224/27334* (2013.01); *H01L 2224/32145* (2013.01); *H01L 2224/32225* (2013.01); *H01L 2224/73103* (2013.01); *H01L 2224/73104* (2013.01); *H01L 2224/73204* (2013.01); *H01L 2224/7532* (2013.01); *H01L 2224/7598* (2013.01); *H01L 2224/75251* (2013.01); *H01L 2224/75272* (2013.01); *H01L 2224/75301* (2013.01); *H01L 2224/75314* (2013.01); *H01L 2224/81* (2013.01); *H01L 2224/81191* (2013.01); *H01L 2224/81193* (2013.01); *H01L 2224/81444* (2013.01); *H01L 2224/81815* (2013.01); *H01L 2224/8321* (2013.01); *H01L 2224/83191* (2013.01); *H01L 2224/83192* (2013.01); *H01L 2224/83203* (2013.01); *H01L 2224/83204* (2013.01); *H01L 2224/83862* (2013.01); *H01L 2224/83986* (2013.01); *H01L 2224/9205* (2013.01); *H01L 2224/9211* (2013.01); *H01L 2224/94* (2013.01); *H01L 2224/97* (2013.01); *H01L 2225/06513* (2013.01); *H01L 2225/06541* (2013.01)

(56) References Cited

U.S. PATENT DOCUMENTS

| | | | | |
|---|---|---|---|---|
| 2014/0312511 | A1* | 10/2014 | Nakamura | H01L 25/065 257/777 |
| 2018/0096980 | A1* | 4/2018 | Asahi | H01L 21/67144 |
| 2018/0312731 | A1 | 11/2018 | Honda | |

FOREIGN PATENT DOCUMENTS

| | | |
|---|---|---|
| JP | 2002-016104 A | 1/2002 |
| JP | 2004-194290 A | 7/2004 |
| JP | 2008-109009 A | 5/2008 |
| JP | 2008-294382 A | 12/2008 |
| JP | 2013-173834 A | 9/2013 |
| JP | 2013-187491 A | 9/2013 |
| JP | 2014-143316 A | 8/2014 |
| WO | 2013/133015 A1 | 9/2013 |

* cited by examiner (a)

(b)

(a)

(b)

(a)

(b)

(a)

(b)

(a)

(b)

METHOD FOR MANUFACTURING SEMICONDUCTOR DEVICE INCLUDING HEATING AND PRESSURING A LAMINATE HAVING AN ADHESIVE LAYER

CROSS-REFERENCE TO RELATED APPLICATIONS

This application is a U.S. national phase application filed under 35 U.S.C. § 371 of International Application No. PCT/JP2016/081774, filed Oct. 26, 2016, designating the United States, which claims priority from Japanese Patent Application No. 2015-212990, filed Oct. 29, 2015, Japanese Patent Application No. 2016-044788, filed Mar. 8, 2016, and Japanese Patent Application No. 2016-115355, filed Jun. 9, 2016, which are hereby incorporated herein by reference in their entirety.

TECHNICAL FIELD

The present invention relates to an adhesive for a semiconductor, a semiconductor device, and a method for manufacturing the same.

BACKGROUND ART

Hitherto, to connect a semiconductor chip to a substrate, a wire bonding method using metal thin lines such as gold wires is widely used. To meet requirements for higher functions, larger scale integration, higher speed, and the like of semiconductor devices, a flip chip connection method (FC connection method) has been becoming popular, in which a conductive projection called a bump is formed on a semiconductor chip or a substrate to directly connect the semiconductor chip to the substrate.

As the flip chip connection method, there are known a method of performing metal bonding by using solder, tin, gold, silver, copper, and the like, a method of performing metal bonding by applying ultrasonic vibration, a method of maintaining mechanical contact by contractive force of a resin, and the like, and from the viewpoint of reliability of a connection portion, a method of performing metal bonding by using solder, tin, gold, silver, copper, and the like is generally used.

Examples of the flip chip connection method in connection between the semiconductor chip and the substrate also include a chip on board (COB) connection method frequently used in ball grid array (BGA), a chip size package (CSP), and the like. The flip chip connection method is also widely used in a chip on chip (COC) connection method in which bumps or circuits are formed on semiconductor chips to connect the semiconductor chips (for example, see Patent Literature 1).

In area-array semiconductor packages used in a CPU, an MPU, and the like, higher functions are strongly demanded. Specific examples of demands include an increase in size of chips, an increase in the number of pins (bumps or circuits), higher density of pitches and gaps.

In packages strongly required for a further reduction in size and thickness as well as higher functions, chip-stack package including chips layered and multi-staged by the above-described connection method, package on package (POP), through-silicon via (TSV), and the like are also spreading widely. Since such layering and multi-staging techniques dispose semiconductor chips in a stereoscopic manner instead of in a planar manner so that a smaller package can be attained, these techniques are effective in an improvement in performance of semiconductors and a reduction in noise, a packaging area, and energy consumption, and receive attention as a semiconductor wiring technique of the next generation.

From the viewpoint of an improvement in productivity, attention also has been paid to a chip on wafer (COW) in which a semiconductor chip is press-bonded (connected) onto a wafer and then singulated to thereby manufacture a semiconductor package and a wafer on wafer (WOW) in which wafers are press-bonded (connected) to each other and then singulated to thereby manufacture a semiconductor package. Furthermore, from the same point of view, attention also has been paid to a gang bonding method in which a plurality of chips are aligned on a wafer or a map substrate and temporarily press-bonded and the plurality of chips are mainly press-bonded collectively to secure connection. The gang bonding method is also used in the aforementioned TSV package (TSV-PKG) and the like.

CITATION LIST

Patent Literature

Patent Literature 1: Japanese Unexamined Patent Publication No. 2008-294382

SUMMARY OF INVENTION

Technical Problem

As the aforementioned flip chip package assembling method, for example, the following method is considered. First, a semiconductor chip fed with an adhesive for a semiconductor is picked up from a diced wafer with a collet and is provided to a pressing member for press-bonding. Subsequently, alignment is performed between a chip and a chip or between a chip and a substrate, and then the chips or the chip and the substrate are temporarily press-bonded to each other. Then, the temperature of the pressing member for press-bonding is increased to reach a temperature equal to or higher than a melting point of a connection portion between the chip and the chip or between the chip and the substrate and a metallic bond is formed on the connection portion so as to mainly press-bond the chip and the chip or the chip and the substrate to each other. In this way, one flip chip package is obtained. Thereafter, the pressing member for press-bonding which has reached a high temperature at the time of main press-bonding is cooled and then the semiconductor chip is picked up again with the pressing member for press-bonding. In a case where the adhesive for a semiconductor is fed to the semiconductor chip, the pressing member for press-bonding picks up the semiconductor chip by adsorbing a surface that is opposite to the surface fed with the adhesive for a semiconductor (surface to be connected), of the semiconductor chip.

In a cycle from the picking-up to the main press-bonding, since one pressing member for press-bonding is used, the temperature of the pressing member for press-bonding needs to be increased to a high temperature at which the metal of the connection portion is melt or to be decreased to a low temperature at which the semiconductor chip fed with the adhesive for a semiconductor can be picked up. However, it takes time to change the temperature of the pressing member for press-bonding, which leads to longer manufacturing time for a semiconductor device. Thus, productivity is likely to be degraded.

In the flip chip connection method in which connection is secured by performing heating to a temperature equal to or higher than a melting point of the metal of the connection portion, the temperature of the pressing member for press-bonding after the main press-bonding becomes high (in a case where the metal of the connection portion is solder, for example, 240° C. or higher). Here, when the semiconductor chip is picked up from the collet without cooling the pressing member for press-bonding, heat of the pressing member for press-bonding is transferred to the collet to increase the temperature of the collet itself. Thus, defects occur at the time of picking-up and thus productivity is likely to be degraded. Further, in the semiconductor chip fed with the adhesive for a semiconductor, heat of the pressing member for press-bonding is transferred to the collet to increase the temperature of the adhesive for a semiconductor by the heat of the collet. According to this, the sticky properties of the adhesive for a semiconductor are exhibited and the adhesive for a semiconductor is easily attached to the collet. Thus, productivity is likely to be degraded. Further, if the temperature of the collet becomes high, when the singulated semiconductor chip is picked up from a dicing tape, heat is transferred to the dicing tape through the collet and the pick-up properties are degraded, which easily results in degraded productivity.

An object of the present invention according to one aspect is to enable higher productivity to be achieved in manufacturing for a semiconductor device, including connecting of connection portions to each other by metal bonding.

Solution to Problem

An aspect of the present invention relates to a method for manufacturing a semiconductor device that includes a semiconductor chip, a substrate and/or another semiconductor chip, and an adhesive layer interposed therebetween, the semiconductor chip, the substrate, and the another semiconductor chip each having a connection portion having a surface formed by a metal material, the connection portion of the semiconductor chip and the connection portion of the substrate and/or the another semiconductor chip being electrically connected by metal bonding. The method sequentially includes the following steps: heating and pressuring a laminate having: the semiconductor chip; the substrate, the another semiconductor chip or a semiconductor wafer including a portion corresponding to the another semiconductor chip; and the adhesive layer disposed therebetween, the connection portion of the semiconductor chip and the connection portion of the substrate or the another semiconductor chip being disposed to face each other, by interposing the laminate with a pair of facing pressing members for temporary press-bonding to thereby temporarily press-bond the substrate, the another semiconductor chip or the semiconductor wafer to the semiconductor chip; and heating and pressuring the laminate by interposing the laminate with a pair of facing pressing members for main press-bonding separately prepared from the pressing members for temporary press-bonding, to thereby electrically connect the connection portion of the semiconductor chip and the connection portion of the substrate or the another semiconductor chip by metal bonding. At least one of the pair of pressing members for temporary press-bonding is heated to a temperature lower than a melting point of the metal material forming the surface of the connection portion of the semiconductor chip and a melting point of the metal material forming the surface of the connection portion of the substrate or the another semiconductor chip when the laminate is heated and pressured. At least one of the pair of pressing members for main press-bonding is heated to a temperature equal to or higher than at least one melting point of a melting point of the metal material forming the surface of the connection portion of the semiconductor chip and a melting point of the metal material forming the surface of the connection portion of the substrate or the another semiconductor chip when the laminate is heated and pressured.

When the step of performing temporary press-bonding at a temperature lower than a melting point of the metal material forming the surface of the connection portion and the step of performing main press-bonding at a temperature equal to or higher than a melting point of the metal material forming the surface of the connection portion are performed by using separate pressing members for press-bonding, a time required for heating and cooling of each of the pressing members for press-bonding can be shortened. Therefore, a semiconductor device can be manufactured with high productivity in a short time as compared to the case of performing press-bonding by one pressing member for press-bonding. As a result, a large number of highly reliable semiconductor devices can be manufactured in a short time.

In the above-described method, a plurality of semiconductor devices can be continuously manufactured by repeating the temporary press-bonding and the main press-bonding while a state where the pressing member for main press-bonding is heated to a temperature equal to or higher than a melting point of the metal material forming the surface of the connection member is maintained.

In a case where the connection portion of the semiconductor chip and the connection portion of the substrate or the another semiconductor chip are contacted to each other at the time of the temporary press-bonding, flowing and scattering of the metal of the connection portion can be suppressed at the time of the main press-bonding step.

By employing the method in which the step until the temporary press-bonding and the main press-bonding step are performed by using two pressing members for press-bonding, which are separately prepared, and the pressing member for main press-bonding is maintained at a high temperature, a time for heating and cooling the pressing member for press-bonding can be shortened and thus improvement in productivity can be expected.

However, in this method, as compared to the conventional method, a high temperature equal to or higher than the melting point of the metal of the connection portion is rapidly applied to the adhesive for a semiconductor at the time of the main press-bonding step. Thus, the curing of the adhesive for a semiconductor is promoted to cause insufficient flowing of the resin so that voids entrained at the time of press-bonding may remain or voids may be generated by the volatilization of the resin. Furthermore, since melting of the metal of the connection portion and the flowing of the resin occur at the same time, failed connection caused by flowing or scattering of the metal of the connection portion and trapping of the resin may occur.

In this regard, in order to sufficiently suppress the generation of voids and to obtain a semiconductor device which is further excellent in connection reliability, the melt viscosity of the adhesive layer may be 7000 Pa·s or less at a temperature to which the pressing member for temporary press-bonding is heated. When the melt viscosity of the adhesive layer at the time of the temporary press-bonding step is 7000 Pa·s or less, failed connection caused by generation of voids and trapping of the resin can be more effectively suppressed.

From the viewpoint of an improvement in productivity, since a time for increasing and decreasing the temperature of the pressing member for press-bonding is required, the temporary press-bonding and the main press-bonding can be performed by the separate pressing members for press-bonding. Further, in the case of conducting collective connection, since a larger number of semiconductor chips are press-bonded in the main press-bonding as compared to the temporary press-bonding, a pressing member for press-bonding provided with a large-area press-bonding head tends to be used. When the plurality of semiconductor chips are mainly press-bonded collectively in this way so that connection can be secured, the productivity of the semiconductor device is improved.

When the plurality of semiconductor chips are mainly press-bonded collectively, a large-area press-bonding head is necessary. However, regarding a large-area press-bonding head that press-bonds a plurality of packages (for example, tool size: about 20 mm or more), when the area of the press-bonding head increases, a difference in height between the packages increases even in the case of the same parallelism, as compared to a conventional small press-bonding head that has been used when one package is assembled (for example, tool size: less than about 20 mm). Therefore, since the area of the press-bonding head increases in the collective connection in which a plurality of semiconductor chips are press-bonded, unevenness (a difference in height) easily occur in the pressing portion and thus failed connection may partially occur when the plurality of semiconductor chips are press-bonded to obtain a package. Semiconductor packages, in which a decrease in thickness of the semiconductor chip, a decrease in size and thickness of the package, or the like has been developed, require higher degree of accuracy of connection.

In this regard, in a case where a plurality of semiconductor chips, a plurality of substrates, and a plurality of other semiconductor chips or semiconductor wafers are mainly press-bonded collectively, in the step of electrically connecting the connection portion of the semiconductor chip and the connection portion of the substrate or the another semiconductor chip by metal bonding, a plurality of laminates disposed on a stage and a sheet for collective connection disposed to cover these laminates may be interposed with the stage and the press-bonding head facing the stage to thereby heat and pressure the plurality of laminates collectively, in order to decrease the proportion of semiconductor devices with failed connection. The sheet for collective connection may have a storage elastic modulus at 250° C. of 10 GPa or less and a displacement at 250° C. of 40 µm or more. The displacement described herein means a displacement when a compressive load is 100 N under the environment of 250° C. in a compression test in which a rod-shaped pressing jig that has a circular end face having a diameter of 8 µm is pressed against a principal surface of the collective connection sheet in a direction in which the principal surface and the end face become parallel to each other.

When the plurality of semiconductor chips (laminates) are press-bonded, by using a sheet for collective connection having a storage elastic modulus at 250° C. of 10 GPa or less and a displacement at 250° C. of 40 µm or more, a difference in height between the plurality of laminates is sufficiently absorbed and favorable parallelism is exhibited so that these laminates can be more uniformly pressured. Therefore, favorable connection can be secured in any of semiconductor devices.

In a case where one semiconductor chip is press-bonded by a press-bonding head having the same size as the semiconductor chip or smaller than the semiconductor chip by several hundred µm, the amount of a fillet (a portion protruding out from the chip) of the adhesive for a semiconductor is increased. Thus, even when the adhesive for a semiconductor creeps in the press-bonding head direction which presses the semiconductor chip, the adhesive for a semiconductor is less likely to be attached to the press-bonding head. Meanwhile, in a case where a plurality of semiconductor chips are press-bonded by a large-area press-bonding head, when the amount of the fillet increases and the fillet creeps, the press-bonding head is contaminated by the adhesive for a semiconductor so that cleaning or the like is necessary. Thus, productivity may be degraded. According to the method for manufacturing a semiconductor device, even when the adhesive protruding out from the semiconductor chip at the time of press-bonding is attached to the sheet for collective connection, the sheet for collective connection is easily replaced so that productivity is less likely to be degraded.

In a method according to another aspect of the present invention, in the step of electrically connecting the connection portion of the semiconductor chip and the connection portion of the substrate or the another semiconductor chip by metal bonding, the laminate is heated in a heating furnace or on a hot plate to a temperature equal to or higher than at least one melting point of a melting point of the metal material forming the surface of the connection portion of the semiconductor chip, or a melting point of the metal material forming the surface of the connection portion of the substrate or the another semiconductor chip.

Also in the case of this method, by separately performing the step of performing temporary press-bonding at a temperature lower than the melting point of the metal material forming the surface of the connection portion and the step of performing heating at a temperature equal to or higher than the melting point of the metal material forming the surface of the connection portion, a time required for heating and cooling the pressing member for temporary press-bonding can be shortened. For this reason, as compared to the case of performing press-bonding by one pressing member for press-bonding, a semiconductor device can be manufactured in a short time with high productivity. As a result, lots of semiconductor devices with high reliability can be manufactured in a short time.

In the above-described method, the plurality of laminates may be collectively heated in a heating furnace or on a hot plate. According to this, semiconductor devices can be manufactured with further higher productivity. The adhesive layer in the above-described method may be a layer containing an adhesive for a semiconductor of [1] to [7] to be described later.

The adhesive layer may be a layer formed by a thermosetting resin composition containing a thermosetting resin having a molecular weight of 10000 or less and a curing agent therefor. That is, the adhesive layer may be a layer containing the above thermosetting resin composition.

The thermosetting resin composition may further contain a polymer component having a weight average molecular weight of 10000 or more. The weight average molecular weight of the polymer component may be 30000 or more. The glass transition temperature of the polymer component may be 100° C. or lower.

The adhesive layer may be a layer formed by an adhesive film which is prepared in advance.

Incidentally, for example, in the gang bonding method in which a plurality of singulated chips are aligned on a wafer or a map substrate and temporarily press-bonded (first step), and then the plurality of chips are collectively heated and press-bonded by a large-area press-bonding tool to secure connection (second step), or the method in which a plurality of singulated chips are similarly aligned on a wafer or a map substrate and temporarily press-bonded (first step), and then the plurality of chips are thermally treated in a chamber that is capable of performing treatment at a high temperature, such as a reflow furnace or an oven, to secure connection (second step), a plurality of packages can be collectively assembled in the second step and an improvement in productivity is expected. In these methods, from the viewpoint of high reliability, a metallic bond tends to be formed by performing heating to a temperature equal to or higher than a melting point of the metal.

Further, in a case where a semiconductor chip fed with the adhesive for a semiconductor is picked up by a press-bonding tool, when the semiconductor chip is picked up at a temperature equal to or higher than a melting point of the metal of the connection portion (for example, in the case of Sn/Ag solder, about 220° C. or higher), picking-up failure caused by exhibition of the sticky properties of the adhesive for a semiconductor or packaging failure caused by progress of curing of the adhesive for a semiconductor (failed connection or void generation due to insufficient flowability) occurs and thus it is necessary to cool the press-bonding tool.

When the package is assembled by separately providing the first step (a step of performing alignment and then temporary press-bonding) and the second step (a step of performing a thermal treatment at a temperature equal to or higher than a melting point of the metal of the connection portion to secure connection), the cooling of the tool can be omitted and thus productivity is improved.

In the second step, from the viewpoint of fillet suppression and damage suppression to the connection portion, expectations have been raised for the method in which a thermal treatment is performed in a chamber that is capable of performing treatment at a high temperature, such as a reflow furnace or an oven, at a low load or no load to secure connection.

Since the second step is loadless, the flowing of the resin (the flowing of the adhesive for a semiconductor) that affects connection securement and void suppression tends to be scarce. For this reason, it is necessary to secure flowability in the first step at a low temperature.

By making voidless and securing connection (contact) in the first step, packaging properties after the second step (void suppression, connection securement) can be improved.

In the manufacturing method in which assembling is performed by separately providing the first step and the second step, which can improve productivity, the flowability of the adhesive for a semiconductor is scarce and voids are likely to remain, thus connection (contact) is difficult to secure. When void suppression and securement of connection (contact) are not sufficient in the first step, voids may remain even after the second step and thus failed connection may occur.

Still another aspect of the present invention is made in order to solve the aforementioned problem, and an object thereof is to provide an adhesive for a semiconductor with which favorable connection (contact) can be secured while voids are suppressed and favorable reflow resistance can be obtained even when used in the method for manufacturing a semiconductor device through the first step and the second step, and to provide a method for manufacturing a semiconductor device and a semiconductor device which use the adhesive for a semiconductor.

According to another aspect of the present invention, there are provided the following [1] to [7] for the main purpose of securing high reliability (void suppression, connection securement, reflow resistance) even in a method of performing collective assembling in which sufficient flowability is secured in a first step to secure void suppression and connection (contact) and thus high productivity is expected in a second step (heating treatment of a reflow furnace or the like).

[1] An adhesive for a semiconductor, containing: (a) a resin component having a weight average molecular weight of less than 10000; (b) a curing agent; and (c) a silanol compound represented by the following General Formula (1):

in the formula, $R^1$ represents an alkyl group or a phenyl group, and $R^2$ represents an alkylene group.

[2] The adhesive for a semiconductor described in [1], in which the $R^1$ is a phenyl group.

[3] The adhesive for a semiconductor described in [1] or [2], in which the (c) silanol compound is solid at 25° C.

[4] The adhesive for a semiconductor described in any one of [1] to [3], further containing (d) a polymer component having a weight average molecular weight of 10000 or more.

[5] The adhesive for a semiconductor described in [4], in which the (d) polymer component having a weight average molecular weight of 10000 or more has a weight average molecular weight of 30000 or more and a glass transition temperature of 100° C. or lower.

[6] The adhesive for a semiconductor described in any one of [1] to [5], in which the adhesive is a film.

[7] The adhesive for a semiconductor described in any one of [1] to [6], in which when a semiconductor device in which connection portions of a semiconductor chip and a wiring circuit substrate are electrically connected to each other or a semiconductor device in which connection portions of a plurality of semiconductor chips are electrically connected to each other is manufactured through a first step of performing press-bonding at a temperature lower than a melting point of a metal of the connection portion and a second step of performing a heating treatment at a temperature equal to or higher than a melting point of the metal of the connection portion to form a metallic bond, the adhesive is used for sealing the connection portion.

Advantageous Effects of Invention

According to an aspect of the present invention, higher productivity can be achieved in manufacturing semiconductor devices that includes connecting of connection portions to each other by metal bonding.

DESCRIPTION OF EMBODIMENTS

Figure 1:
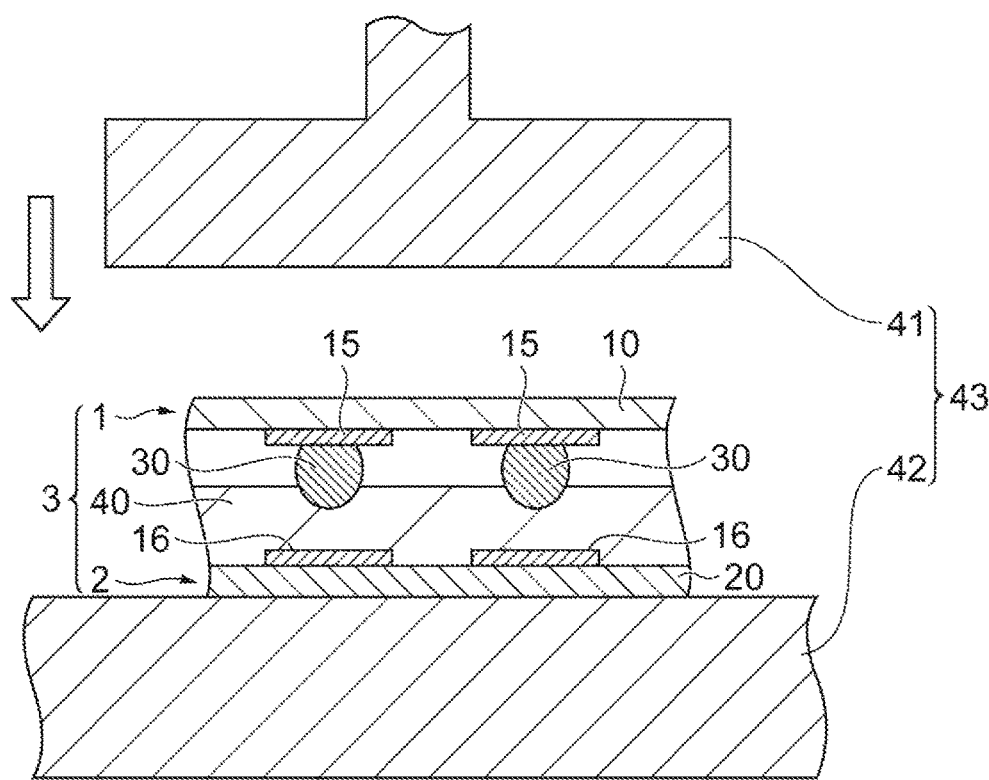
FIG. 1 is a process diagram illustrating an example of a step of temporarily press-bonding a substrate to a semiconductor chip.
Figure 1:
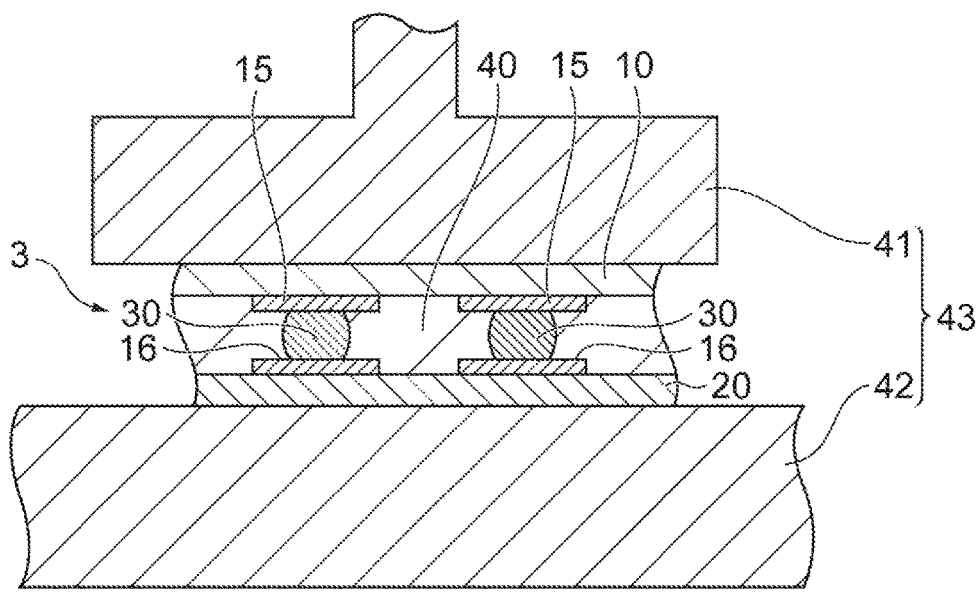

Hereinafter, preferable embodiments of the present invention will be described in detail with reference to the drawings in some cases. However, the present invention is not limited to the following embodiments. In the drawings, some reference numerals are given to identical or equivalent portions, and duplication of description may be omitted. Positional relations such as up, down, left, and right are based on positional relations shown in the drawings unless otherwise specified. Dimensional ratios in the drawings will not be limited to ratios shown in the drawings. Upper limits and lower limits of these numerical ranges described in the present specification can be in any combinations. Numerical values described in Examples can also be used as the upper limits and the lower limits of the numerical ranges. In the present specification, "(meth)acryl" means acryl or corresponding methacryl.

Method for Manufacturing Semiconductor Device

First Embodiment

FIG. 1 is a process diagram illustrating an example of a step of temporarily press-bonding a substrate to a semiconductor chip in a method for manufacturing a semiconductor device according to the present embodiment.

First, as illustrated in FIG. 1(a), a semiconductor chip 1 having a semiconductor chip main body 10 and bumps 30 as connection portions is superimposed on a substrate 2 having a substrate main body 20 and circuits 16 as connection portions while an adhesive layer 40 is disposed therebetween to thereby form a laminate 3. The semiconductor chip 1 is formed by dicing of a semiconductor wafer and then picked up to be conveyed above the substrate 2, and the semiconductor chip 1 is aligned such that the bumps 30 and the circuits 16 as connection portion are disposed to face each other. The laminate 3 is formed on a stage 42 of a pressing device for temporary press-bonding 43 having a press-bonding head 41 and the stage 42 as a pair of pressing members for temporary press-bonding which are disposed to face each other. The bumps 30 are provided on the circuits 15 disposed on the semiconductor chip main body 10. The circuits 16 of the substrate 2 are provided at predetermined positions on the substrate main body 20. The bumps 30 and the circuits 16 each have a surface formed by a metal material.

The adhesive layer 40 may be a layer formed by attaching the adhesive film, which is prepared in advance, to the substrate 2. The adhesive film can be attached by heat press, roll lamination, vacuum lamination, or the like. The applied area and thickness of the adhesive film are properly set according to the size of the semiconductor chip 1 or the substrate 2, the height of the connection portion, and the like. The adhesive film may be attached to the semiconductor chip 1. The adhesive film may be attached to a semiconductor wafer, and then the semiconductor wafer may be singulated by dicing the semiconductor wafer to prepare the semiconductor chip 1 attached with the adhesive film.

Subsequently, as illustrated in FIG. 1(b), the laminate 3 is heated and pressured by interposing the laminate 3 with the stage 42 and the press-bonding head 41 as the pressing members for temporary press-bonding to thereby temporarily press-bond the substrate 2 to the semiconductor chip 1. In the case of the embodiment of FIG. 1, the press-bonding head 41 is disposed at the semiconductor chip 1 side of the laminate 3, and the stage 42 is disposed at the substrate 2 side of the laminate 3. The temporary press-bonding may be performed such that the connection portion of the semiconductor chip 1 and the connection portion of the substrate 2 are contacted. According to this, in the subsequent heating step, the metal bonding between the connection portions is easily formed and the biting of the adhesive layer between the connection portions can be reduced so that connectivity is further improved.

At least one of the stage 42 or the press-bonding head 41 is heated to a temperature lower than a melting point of the metal material forming the surface of the bump 30 as the connection portion of the semiconductor chip 1 and a melting point of the metal material forming the surface of the circuit 16 as the connection portion of the substrate 2 when the laminate 3 is heated and pressured for the temporary press-bonding.

In the step of temporarily press-bonding the substrate 2 to the semiconductor chip 1, the temperature of the pressing member for temporary press-bonding is preferably low in order not to transfer heat to the semiconductor chip or the like when the semiconductor chip is picked up. When heating and pressuring for the temporary press-bonding are performed, the pressing member for temporary press-bonding may be heated to such a high temperature as to increase the flowability of the adhesive layer such that voids at the time of entrainment can be removed. In order to shorten the cooling time, a difference between the temperature of the pressing member when the semiconductor chip is picked up and the temperature of the pressing member when the temporary press-bonding is performed may be small. This temperature difference may be 100° C. or lower or 60° C. or lower.

This temperature difference may be constant. When the temperature difference is 100° C. or lower, the time for cooling the pressing member for temporary press-bonding is shortened and thus productivity tends to be further improved.

The temperature of the pressing member for temporary press-bonding may be set to be lower than a reaction initiation temperature of the adhesive layer. The reaction initiation temperature is an on-set temperature when exotherm caused by the reaction of the adhesive layer is measured by using DSC (manufactured by PerkinElmer Co., Ltd., DSC-Pyirs 1) under the conditions including a sample amount of 10 mg, a temperature increasing rate of 10° C./min, and a measurement atmosphere of air or nitrogen.

From the above point of view, the temperature of the stage 42 and/or the press-bonding head 41 may be, for example, 30° C. or higher 130° C. or lower during the semiconductor chip is picked up, and the temperature thereof may be, for example, 50° C. or higher 150° C. or lower during the laminate 3 is heated and pressured for the temporary press-bonding.

At a temperature T to which the pressing member for temporary press-bonding is heated for the temporary press-bonding (a temperature of the pressing member for temporary press-bonding during heating and pressuring the laminate), the melt viscosity of the adhesive layer may be 7000 Pa·s or less. Herein, the "melt viscosity" refers to the viscosity of the adhesive layer in a molten state at the temperature T when measurement is performed with a rheometer (manufactured by Anton Paar Japan K.K., MCR301) by using a measurement jig (a disposable plate (diameter: 8 mm) and a disposable sample dish) under the conditions including a sample thickness of 400 µm, a temperature increasing rate of 10° C./min, and frequency of 1 Hz.

The temperature T to which the pressing member for temporary press-bonding is heated for the temporary press-bonding may be equal to or lower than the reaction initiation temperature of the adhesive layer and a temperature at which the viscosity of the adhesive layer is the lowest and the resin easily flows. However, when the viscosity is too low, the resin creeps up the chip side surface and is attached to the pressing member for press-bonding, and thus this makes productivity to be degraded in some cases. For this reason, in the step of the temporary press-bonding, the melt viscosity of the adhesive layer may be 1000 Pa·s or more at the temperature T to which the pressing member for temporary press-bonding is heated for the temporary press-bonding.

The load for the temporary press-bonding may be, for example, 0.009 to 0.2 N per 1 pin (1 bump) of the semiconductor chip from the viewpoint of removing voids between the semiconductor chips or between the semiconductor chip and the substrate and sufficiently contacting the connection portions to each other.

Figure 2:
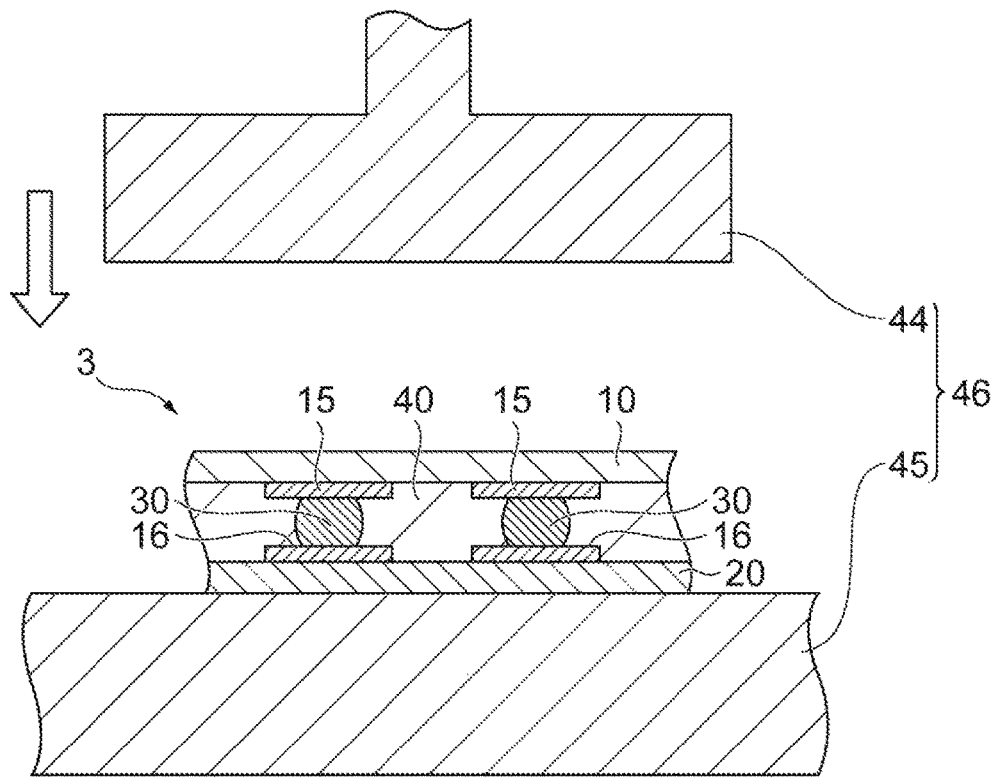
FIG. 2 is a process diagram illustrating an example of a step of electrically connecting a connection portion of a semiconductor chip and a connection portion of a substrate by metal bonding.
Figure 2:
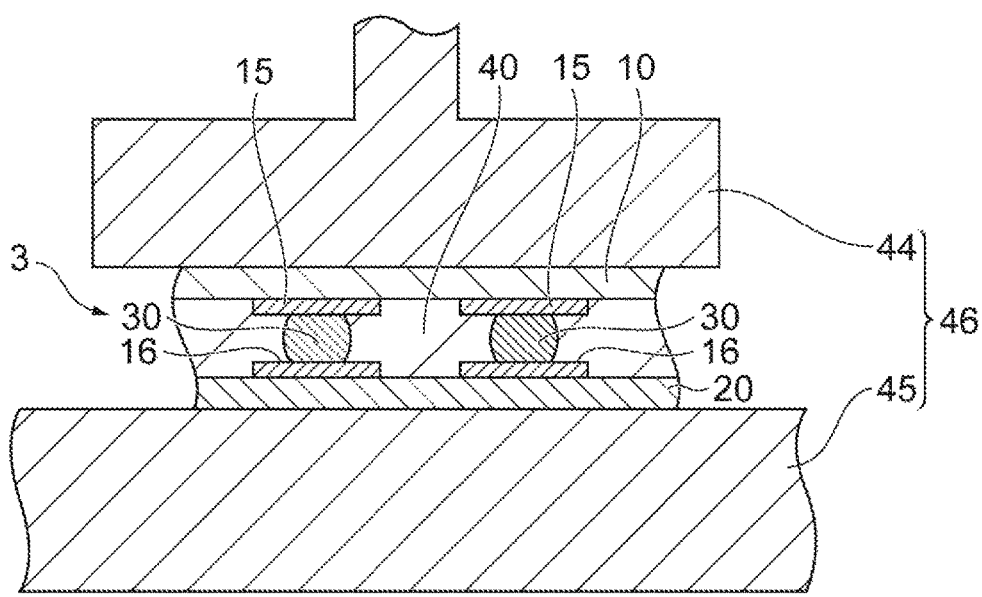

FIG. 2 is a process diagram illustrating an example of a step of main press-bonding in which a connection portion of a semiconductor chip and a connection portion of a substrate are electrically connected by metal bonding.

As illustrated in FIGS. 2(a) and 2(b), the laminate 3 is further heated and pressured by using a pressing device for main press-bonding 46 having a stage 45 and a press-bonding head 44 as pressing members for main press-bonding, which is separately prepared from the pressing device 43. The laminate 3 is heated and pressured by interposing the laminate 3 with the stage 45 and the press-bonding head 44, and accordingly, the bumps 30 and the circuits 16 are electrically connected by metal bonding. According to this, the semiconductor chip 1 and the substrate 2 are mainly press-bonded. In the embodiment of FIG. 2, the press-bonding head 44 is disposed at the semiconductor chip 1 side of the laminate 3, and the stage 45 is disposed at the substrate 2 side of the laminate 3.

At least one of the stage 45 or the press-bonding head 44 is heated to a temperature equal to or higher than at least one melting point of a melting point of the metal material forming the surface of the bump 30 as the connection portion of the semiconductor chip 1, or a melting point of the metal material forming the surface of the circuit 16 as the connection portion of the substrate 2, when the laminate 3 is heated and pressured. This heating temperature (the temperature of the stage 45 and/or the press-bonding head 44 in the main press-bonding) may be 230° C. or higher or 250° C. or higher or may be 330° C. or lower or 300° C. or lower in a case where the metal material of the connection portion contains solder. When the heating temperature is 230° C. or higher or 250° C. or higher, the solder of the connection portion is melted to easily form a sufficient metallic bond. When the heating temperature is 330° C. or lower or 300° C. or lower, voids are less likely to be generated and the scattering of the solder can be further suppressed. The temperature in the main press-bonding may be constant during the step of main press-bonding from the viewpoint of eliminating the cooling time and improving productivity.

The temperature of the stage 45 and/or the press-bonding head 44 may be maintained to a certain level of temperature or higher during a plurality of semiconductor devices are continuously manufactured by repeatedly and sequentially heating and pressuring a plurality of the laminates 3. In other words, while maintaining the stage 45 and/or the press-bonding head 44 to a certain level of temperature or higher, the main press-bonding may be continuously performed in plural times by sequentially switching the laminates 3. By maintaining the device to temperature in a certain range, the cooling time is not necessary and productivity is further improved. The temperature of the stage 45 and/or the press-bonding head 44 may slightly change due to escaping of heat at the time of contact with external air and the semiconductor chip, but there is no problem as long as the change is within a range of ±10° C. or lower.

The temperature of the stage 45 and/or the press-bonding head 44 may be a temperature higher than the reaction initiation temperature of the adhesive layer when the laminate is heated and pressured. By promoting the curing of the adhesive layer during the main press-bonding, void suppression and connectivity tend to be further improved.

The pressing member for temporary press-bonding and the pressing member for main press-bonding may be respectively provided on two or more of respective devices, or both the pressing members may be provided inside one device. A two-head-type device provided with a pressing member for temporary press-bonding and a pressing member for main press-bonding may be used.

In the embodiments of FIGS. 1 and 2, the example of the step of press-bonding the semiconductor chip and the substrate has been described, but the method for manufacturing a semiconductor device may include a step of press-bonding the semiconductor chips to each other. Instead of the semiconductor chip 1, a semiconductor wafer which includes a plurality of portions corresponding to the semiconductor chip 1 and has not yet been diced, may be used. The semiconductor chips are pressed against each other while being heated at a temperature equal to or higher than the melting point of the bump to connect the semiconductor chip to the semiconductor chip and the gap between the semiconductor chips is filled with the adhesive film such that the connection portions are sealed. In a case where the metal material of the connection portion contains solder, the semiconductor chip may be heated such that the temperature of the connection portion (solder portion) becomes 230° C. or higher or 250° C. or higher. A connection load depends on the number of bumps, but it is set in consideration of the absorption of a variation of the height of the bumps, or the control of the amount of deformation of the bumps. The connection time may be set to a short time from the viewpoint of an improvement in productivity. While the solder is melted and an oxide film or a surface impurity is removed, metal bonding may be formed in the connection portions.

The press-bonding time for the temporary press-bonding and the connection time (press-bonding time) for the main press-bonding may be set to a short time from the viewpoint of an improvement in productivity. The short connection time (press-bonding time) means that a time (for example, a time when solder is used) for which the connection portion is heated to 230° C. or higher during the connection formation (main press-bonding) is 5 seconds or shorter. The connection time may be 4 seconds or shorter or 3 seconds or shorter. When each press-bonding time is shorter than the cooling time, the effect of the manufacturing method of the present invention can be further exhibited.

As a pressing device for temporary press-bonding or main press-bonding, a flip chip bonder, a pressure oven, or the like can be used.

In the temporary press-bonding and the main press-bonding, a plurality of chips may be press-bonded. For example, in the gang bonding in which a plurality of chips are press-bonded in a planar manner, a plurality of semiconductor chips may be temporarily press-bonded one by one to a wafer or a map substrate and then the plurality of chips may be mainly press-bonded collectively.

In the stack press-bonding that is often seen in a package having a TSV structure, a plurality of chips are press-bonded in a stereoscopic manner. Also in this case, a plurality of semiconductor chips may be stacked one by one and temporarily press-bonded, and then the plurality of chips may be mainly press-bonded collectively.

Second Embodiment

Figure 3:
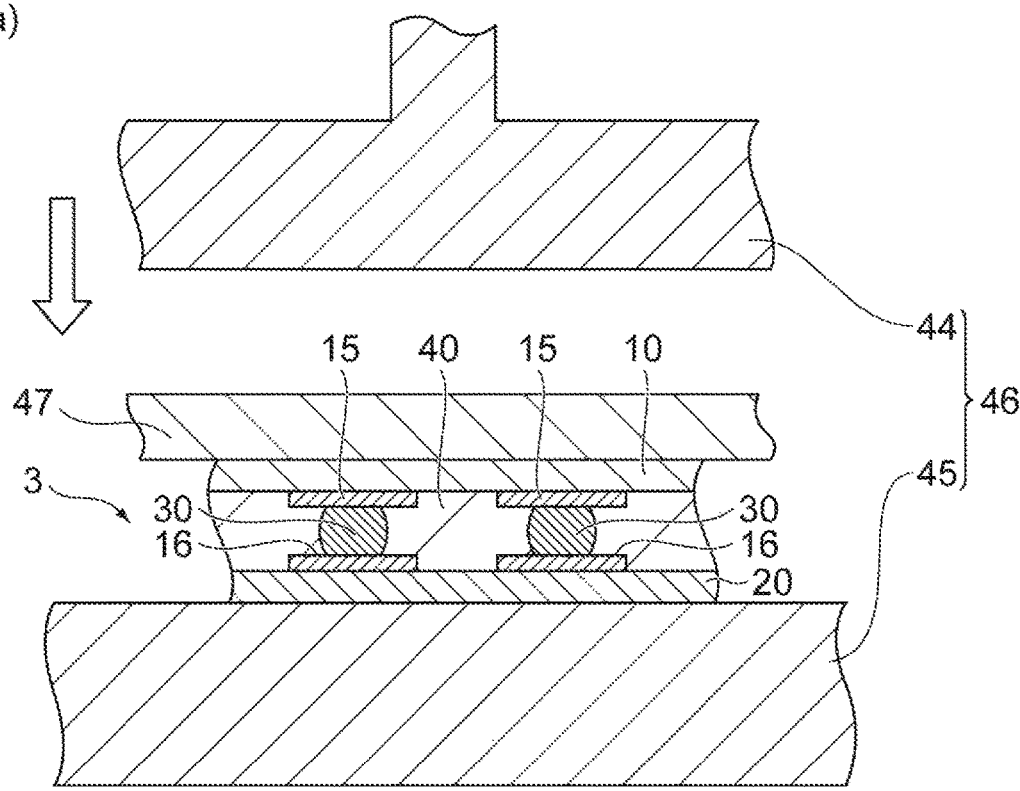
FIG. 3 is a process diagram illustrating an example of a step of electrically connecting a connection portion of a semiconductor chip and a connection portion of a substrate by metal bonding using a sheet for collective connection.
Figure 3:
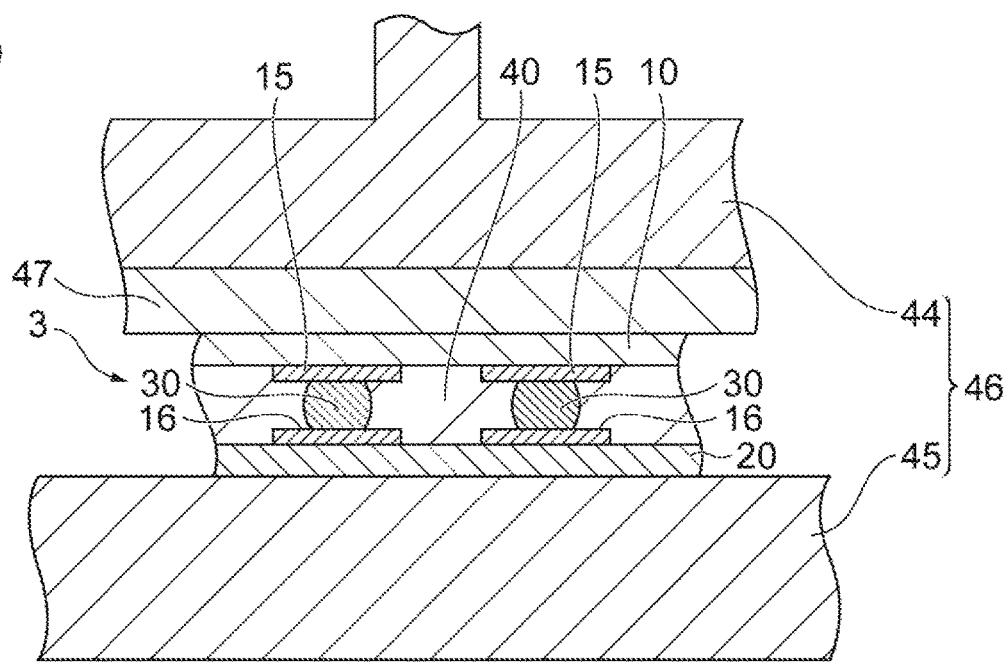

A method for manufacturing a semiconductor device according to a second embodiment also includes a step of temporarily fixing a semiconductor chip and a substrate or another semiconductor chip to obtain a laminate, and then mainly press-bonding the laminate by a pressing member for main press-bonding including a stage and a press-bonding head. The step of temporarily fixing a semiconductor chip and a substrate or another semiconductor chip to obtain a laminate may be the same embodiment as in the temporary press-bonding of the first embodiment. The second embodiment is different from the first embodiment in that a plurality of laminates disposed on a stage and a sheet for collective connection disposed to cover these laminates are interposed with the stage and the press-bonding head facing the stage to thereby mainly press-bond the plurality of laminates collectively by being heated and pressured. The other points of the second embodiment are the similar to those of the first embodiment. FIG. 3 is a process diagram illustrating an example of a step of main press-bonding in which a connection portion of a semiconductor chip and a connection portion of a substrate are electrically connected by metal bonding using a sheet for collective connection. A laminate having a semiconductor wafer and a plurality of semiconductor chips may be disposed on a stage and covered with a sheet for collective connection.

As illustrated in FIGS. 3(a) and 3(b), the laminate 3 is further heated and pressured by using the pressing device for main press-bonding 46 having the stage 45 and the press-bonding head 44 as pressing members for main press-bonding, which is separately prepared from the pressing device for temporary press-bonding 43. The plurality of laminates 3 are arranged on the stage 45 and a sheet for collective connection 47 is disposed to cover the laminates 3. Then, the sheet for collective connection 47 and the plurality of laminates 3 are interposed together by the stage 45 and the press-bonding head 44 so that the plurality of laminates are heated and pressured collectively. According to this, the bumps 30 and the circuits 16 are electrically connected by metal bonding. In the embodiment of FIG. 3, the press-bonding head 44 is disposed at the semiconductor chip 1 side of the laminate 3 and the stage 45 is disposed at the substrate 2 side of the laminate 3.

The area of the surface of the press-bonding head 44 to which the semiconductor chip is contacted may be 50 mm×50 mm or more from the viewpoint of collectively press-bonding a larger number of semiconductor chips to improve productivity of the semiconductor device. The area of the surface of the press-bonding head 44 to which the semiconductor chip is contacted may be about 330 mm×330 mm from the viewpoint that it can correspond to a wafer having a 12-inch size.

Sheet for Collective Connection

The raw material of the sheet for collective connection is not particularly limited as long as it is a resin exhibiting a specific storage elastic modulus and a specific displacement at 250° C. Examples of the resin include polytetrafluoroethylene resins, polyimide resins, phenoxy resins, epoxy resins, polyamide resins, polycarbodiimide resins, cyanate ester resins, acrylic resins, polyester resins, polyethylene resins, polyethersulfone resins, polyether imide resins, polyvinyl acetal resins, urethane resins, and acrylic rubbers. The sheet for collective connection may be a sheet containing at least one resin selected from polytetrafluoroethylene resins, polyimide resins, epoxy resins, phenoxy resins, acrylic resins, acrylic rubbers, cyanate ester resins, and polycarbodiimide resins from the viewpoint of having excellent heat resistance and film forming properties. The resin of the sheet for collective connection may be a sheet containing at least one resin selected from polytetrafluoroethylene resins, polyimide resins, phenoxy resins, acrylic resins, and acrylic rubbers from the viewpoint of having excellent heat resistance and film forming properties. These resins can be used singly or in combination of two or more kinds thereof.

When the storage elastic modulus of the sheet for collective connection at 250° C. is low, favorable connection tends to be easily secured when the semiconductor chip is pressed by using the press-bonding head having a large area. For this reason, the storage elastic modulus of the sheet for collective connection at 250° C. may be, for example, 10 GPa or less or 8 GPa or less. When the storage elastic modulus of the sheet for collective connection at 250° C. is high, the sheet for collective connection has proper softness. Thus, there is a tendency that a difference in height between the plurality of laminates is further absorbed and favorable parallelism is exhibited so that these laminates can be more uniformly pressured. Therefore, the storage elastic modulus of the sheet for collective connection at 250° C. may be 0.01 GPa or more or 0.1 GPa or more. The storage elastic modulus at 250° C. can be measured by using a general elastic modulus measurement apparatus. For example, the viscoelasticity of a sample is measured by using an elastic modulus measurement apparatus RSA2 (manufactured by Rheometric Scientific) or the like while the temperature is increased from −30° C. to 300° C. under the conditions including a frequency 10 Hz and a temperature increasing rate of 5° C./min and the storage elastic modulus at 250° C. can be determined from the measurement result.

In the sheet for collective connection, the storage elastic modulus at 250° C. may satisfy the above range and the sufficient displacement at 250° C. may be, for example, 40 μm or more. When this displacement is 40 μm or more, particularly favorable connection can be secured when the plurality of semiconductor chips are mainly press-bonded collectively. The displacement at 250° C. may be 200 μm or less. In this specification, the displacement means a displacement when a compressive load is 100 N under the environment of 250° C. in a compression test in which a rod-shaped pressing jig having a circular end face with a diameter of 8 μm is pressed against a principal surface of the collective connection sheet in a direction in which the principal surface and the end face become parallel to each other. The displacement can be, for example, measured by using an electromechanical universal testing machine (manufactured by INSTRON).

The sheet for collective connection may have high heat resistance. From the viewpoint of enhancing productivity of the semiconductor device, the sheet for collective connection may be a sheet which is not melted when being press-bonded at 250° C. or higher and is not attached to the semiconductor chip.

The sheet for collective connection may have high transparency from the viewpoint that the pressing member for main press-bonding can recognize an alignment mark (recognition mark for alignment) on the semiconductor chip or the substrate covered with the sheet for collective connection. The transmittance of the sheet for collective connection at a wavelength of 550 nm may be, for example, 10% or more.

The thickness of the sheet for collective connection can be properly designed to satisfy the above properties. The thickness may be, for example, 50 μm or more, 80 μm or more, or 100 μm or more. The thickness of the sheet for collective connection may be 300 μm or less.

The sheet for collective connection may be a commercially available elastic sheet. Examples of the commercially available elastic sheet include NITOFLON 900UL (manufactured by Nitto Denko Corporation) and UPILEX SGA (manufactured by Ube Industries, Ltd.).

When the sheet for collective connection having a specific storage elastic modulus and a specific displacement is used, a difference in height between the plurality of laminates is sufficiently absorbed and favorable parallelism is exhibited so that these laminates can be more uniformly pressed. Therefore, further favorable connection can be secured in any of semiconductor devices. Further, since replacement is easy to conduct even when the adhesive protruding out from the semiconductor chip at the time of the press-bonding is attached to the sheet for collective connection, productivity is less likely to be degraded.

Third Embodiment

Figure 4:
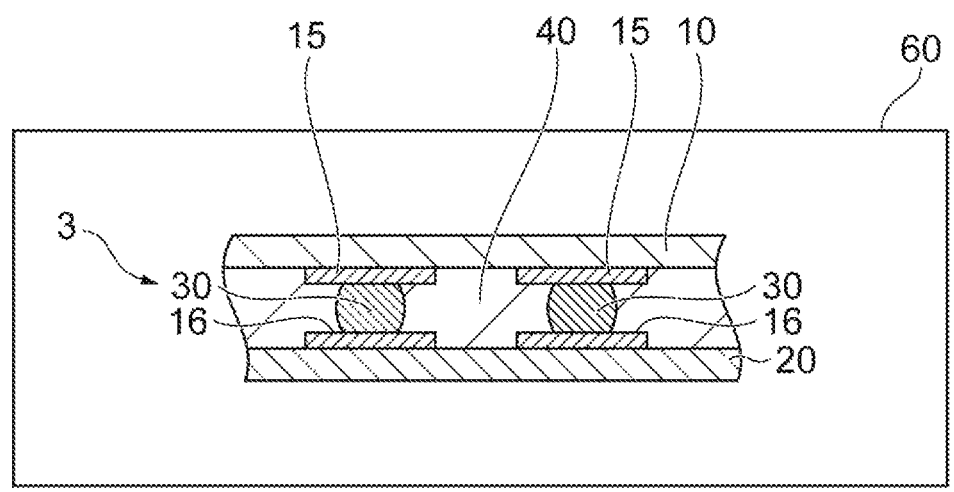
FIG. 4 is a process diagram illustrating an example of a step of electrically connecting a connection portion of a semiconductor chip and a connection portion of a substrate by metal bonding.

In a method for manufacturing a semiconductor device according to a third embodiment, subsequent to the same temporary press-bonding as in the first embodiment, as illustrated in FIG. 4, the temporarily press-bonded laminate 3 is heated in a heating furnace 60 to electrically connect the bumps 30 of the semiconductor chip 1 and the circuits 16 of the substrate 2 by metal bonding. The method according to the third embodiment is the same as the first embodiment except for the above-described point. A plurality of laminates may be heated in one heating furnace 60 to collectively perform connection in the plurality of laminates.

A gaseous matter in the heating furnace 60 is heated to a temperature equal to or higher than at least one melting point of a melting point of the metal material forming the surface of the connection portion of the semiconductor chip 1 or a melting point of the metal material forming the surface of the connection portion of the substrate 2, when the laminate is heated.

The temperature of the gaseous matter in the heating furnace 60 may be 230° C. or higher and 330° C. or lower during the laminate is heated in a case where the metal material of the connection portion contains solder. When the temperature of the gaseous matter in the heating furnace 60 is 230° C. or higher, the solder of the connection portion is melted and thus a sufficient metallic bond is easily formed. When the temperature of the gaseous matter in the heating furnace 60 is 330° C. or lower, voids are less likely to be generated and the scattering of the solder can be further suppressed. The pressure in the heating furnace 60 is not particularly limited, but may be atmospheric pressure.

The temperature of the gaseous matter in the heating furnace 60 may be a temperature higher than the reaction initiation temperature of the adhesive layer during the laminate is heated. By promoting the curing of the adhesive layer during the heating step, void suppression and connectivity can be further improved.

The laminate may be heated in a state where a weight is placed on the laminate or the laminate is fixed with a clip in the heating furnace 60. According to this, the warpage and failed connection generated by a difference in thermal expansion between the semiconductor chip and the substrate and between the semiconductor chip and the adhesive layer can be further suppressed.

As the heating furnace, a reflow furnace, an oven, or the like can be used. Alternatively, the laminate may be heated on a hot plate. In this case, the temperature of the hot plate can be set to the same temperature as that of air in the heating furnace.

The step of connecting the connection portions (heating step) may promote the curing of the adhesive layer as well as formation of the metallic bond. In the case of performing connection using a pressing member for press-bonding, the heat of the pressing member for press-bonding is less likely to be transferred to a fillet that is an adhesive protruding to the chip side surface at the time of press-bonding. For this reason, in order to further sufficiently cure a fillet portion or the like after connection, a heating treatment step is further required. However, in a case where a reflow furnace, an oven, a hot plate, or the like that applies heat to the whole laminate is used without using the pressing member for press-bonding, the heating treatment after connection can be shortened or omitted.

Semiconductor Device

A semiconductor device obtained by the method for manufacturing a semiconductor device according to the present embodiment will be described. A connection portion in the semiconductor device according to the present embodiment may be any of metal bonding between a bump and a circuit or metal bonding between a bump and a bump. In the semiconductor device according to the present embodiment, for example, flip chip connection providing electric connection through an adhesive layer can be used.

Figure 5:
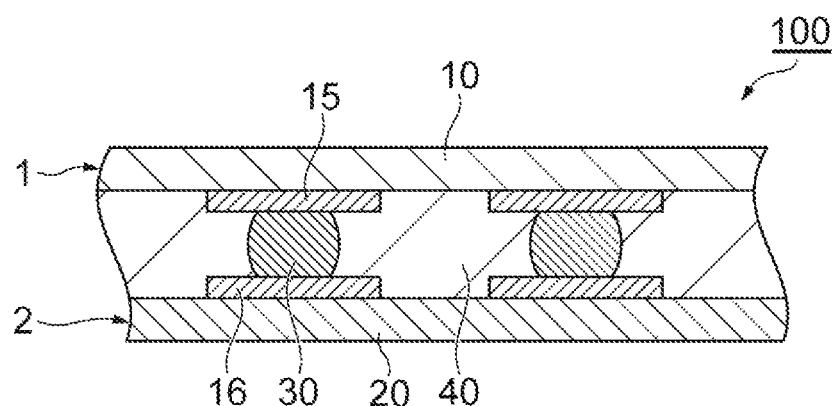
FIG. 5 is a schematic cross-sectional view illustrating an embodiment of a semiconductor device.
Figure 5:
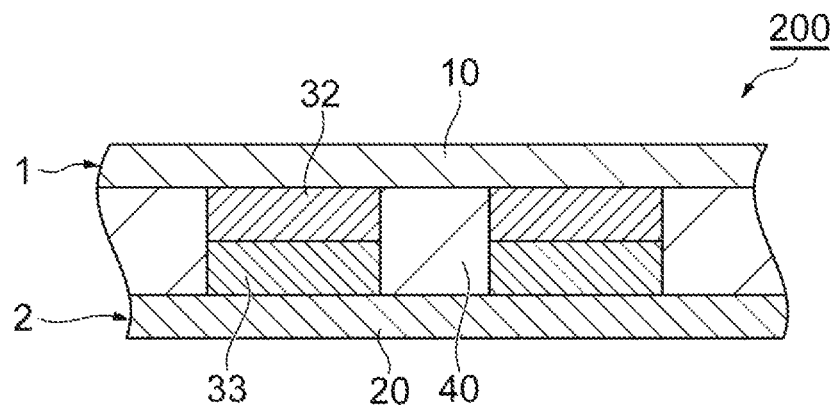

FIG. 5 is a schematic cross-sectional view illustrating an embodiment of a semiconductor device (a COB type connection of a semiconductor chip and a substrate). A semiconductor device 100 illustrated in FIG. 5(a) includes a semiconductor chip 1, a substrate (wiring circuit substrate) 2, and an adhesive layer 40 interposed therebetween. In the case of the semiconductor device 100, the semiconductor chip 1 has a semiconductor chip main body 10, circuits 15 disposed on the surface of the semiconductor chip main body 10 at the substrate 2 side, and bumps 30 as connection portions disposed on the circuits 15. The substrate 2 has a substrate main body 20 and circuits 16 as connection portions disposed on the surface of the substrate main body 20 at the semiconductor chip 1 side. The bumps 30 of the semiconductor chip 1 and the circuits 16 of the substrate 2 are electrically connected by metal bonding. The semiconductor chip 1 and the substrate 2 are flip chip connected through the circuits 16 and the bumps 30. The circuits 15 and 16 and the bumps 30 are sealed with the adhesive layer 40 to be shielded against an external environment.

A semiconductor device 200 illustrated in FIG. 5(b) includes a semiconductor chip 1, a substrate 2, and an adhesive layer 40 interposed therebetween. In the case of the semiconductor device 200, the semiconductor chip 1 has bumps 32 as connection portions disposed on the surface of the semiconductor chip 1 at the substrate 2 side. The substrate 2 has bump 33 as connection portions disposed on the surface of the substrate 2 at the semiconductor chip 1 side. The bumps 32 of the semiconductor chip 1 and the bumps 33 of the substrate 2 are electrically connected by metal bonding. The semiconductor chip 1 and the substrate 2 are flip chip connected through bumps 32 and 33. The bumps 32 and 33 are sealed with the adhesive layer 40 to be shielded against an external environment.

Figure 6:
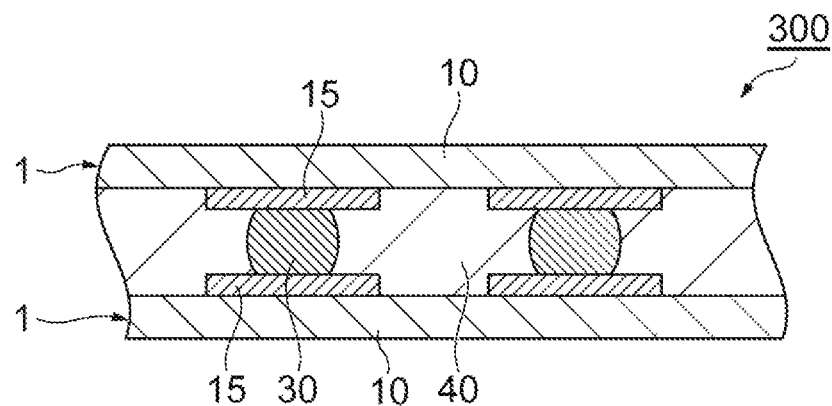
FIG. 6 is a schematic cross-sectional view illustrating another embodiment of a semiconductor device.
Figure 6:
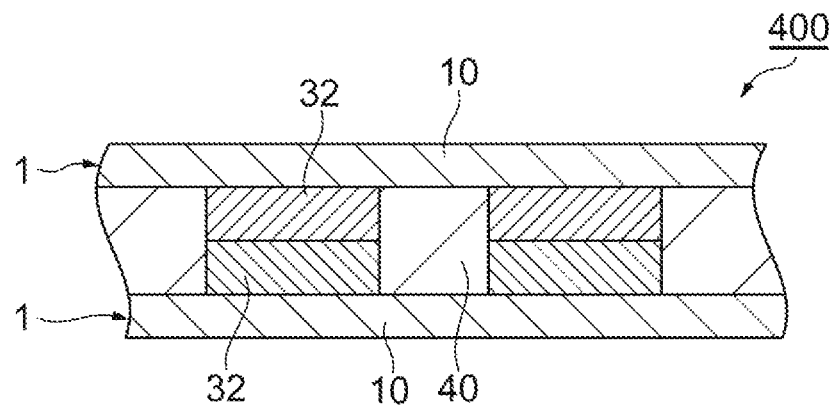

FIG. 6 is a schematic cross-sectional view illustrating another embodiment of a semiconductor device (a COC type connection of semiconductor chips). The configuration of a semiconductor device 300 illustrated in FIG. 6(a) is similar to that of the semiconductor device 100, except that two semiconductor chips 1 are flip chip connected through circuits 15 and bumps 30. The configuration of a semiconductor device 400 illustrated in FIG. 6(b) is similar to that of the semiconductor device 200, except that two semiconductor chips 1 are flip chip connected through bumps 32.

In FIGS. 5 and 6, the connection portions such as the circuits 15 and the bumps 32 may be a metal film (for example, gold plating) called a pad, or a post electrode (for example, a copper pillar). For example, in FIG. 6(b), in an embodiment in which one semiconductor chip has a copper pillar and a connection bump (solder: tin-silver) as connection portions and the other semiconductor chip has gold plating as a connection portion, if the connection portion reaches a temperature equal to or higher than a melting point of the solder having the lowest melting point among the metal materials of the connection portions, the solder is melted to form metal bonding between the connection portions so that electrical connection between the connection portions can be realized.

The semiconductor chip main body 10 is not particularly limited, and various semiconductors such as an element semiconductor composed of one identical element such as silicon or germanium, and a compound semiconductor such as gallium arsenic or indium phosphorus can be used.

The substrate 2 is not particularly limited as long as it is a wiring circuit substrate, and a circuit substrate having circuits (circuit pattern) formed on the surface of an insulating substrate including glass epoxy, polyimide, polyester, ceramic, epoxy, bismaleimide triazine, or the like as a main component by removing unnecessary portions of a metal layer by etching, a circuit substrate having circuits (circuit pattern) formed on the surface of the insulating substrate by metal plating or the like, a circuit substrate having circuits (circuit pattern) formed by printing a conductive material on the surface of the insulating substrate, and the like can be used.

As the materials of the connection portions such as the circuits 15 and 16, the bumps 30, and the bumps 32 and 33 (conductive projections), gold, silver, copper, solder (the main component is, for example, tin-silver, tin-lead, tin-bismuth, tin-copper, or tin-silver-copper), tin, nickel, or the like is used as the main component, and the connection portions may be formed by only single component or a plurality of components. The connection portions may have a structure in which these metals are laminated. Among metal materials, copper and solder are relatively inexpensive. From the viewpoint of improving connection reliability and suppressing warpage, the connection portions may contain solder.

As the materials of the pads, gold, silver, copper, solder (the main component is, for example, tin-silver, tin-lead, tin-bismuth, tin-copper, or tin-silver-copper), tin, nickel, or the like is used as the main component, and the pads may be formed by only single component or a plurality of components. The pads may have a structure in which these metals are laminated. From the viewpoint of connection reliability, the pads may contain gold and/or solder.

A metal layer containing, as the main component, gold, silver, copper, solder (the main component is, for example, tin-silver, tin-lead, tin-bismuth, or tin-copper), tin, nickel, or the like may be formed on the surfaces of the circuits 15 and 16 (circuit pattern). This metal layer may be formed by only single component or a plurality of components. The metal layer may have a structure in which a plurality of metal layers are laminated. The metal layer may contain copper and/or solder that are relatively inexpensive. From the viewpoint of improving connection reliability and suppressing warpage, the metal layer may contain solder.

The semiconductor devices (package) as illustrated in FIG. 5 or FIG. 6 may be stacked and electrically connected by gold, silver, copper, solder (the main component is, for example, tin-silver, tin-lead, tin-bismuth, tin-copper, tin-silver-copper), tin, nickel, or the like. The metal to be used for connection may be copper and/or solder that is relatively inexpensive. For example, as seen in the TSV technique, the adhesive layer may be interposed between the semiconductor chips, the semiconductor chips may be flip chip connected or stacked, holes penetrating through the semiconductor chip may be formed, and electrodes on the patterned surface may be connected.

Figure 7:
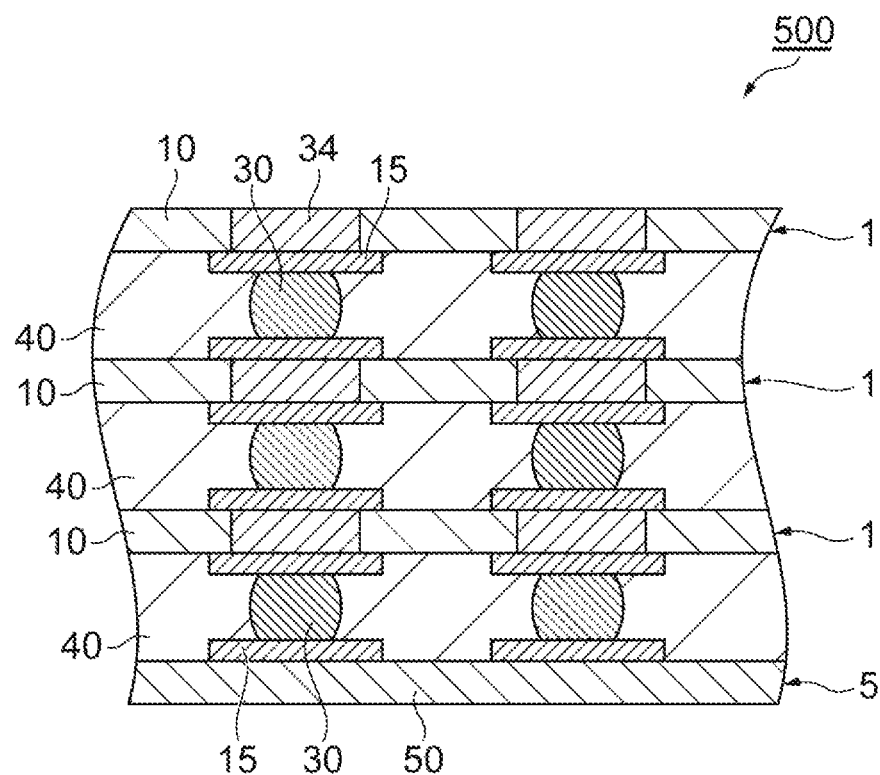
FIG. 7 is a schematic cross-sectional view illustrating still another embodiment of a semiconductor device.

FIG. 7 is a schematic cross-sectional view illustrating another embodiment of the semiconductor device (an embodiment of a semiconductor chip laminate type (TSV)). In a semiconductor device 500 illustrated in FIG. 7, the circuits 15 formed on an interposer main body 50 as the substrate are connected to the bumps 30 of the semiconductor chip 1 to flip chip connect the semiconductor chip 1 to an interposer 5. The adhesive layer 40 is interposed between the semiconductor chip 1 and the interposer 5. The semiconductor chips 1 are repeatedly laminated on the surface of the semiconductor chip 1 on the side opposite to the interposer 5, while the circuits 15, the bumps 30, and the adhesive layer 40 are provided therebetween. The circuits 15 disposed on patterned front and rear surfaces of the semiconductor chip 1 are connected to each other through penetrating electrode 34 provided inside of holes penetrating through the inside of the semiconductor chip main body 10. Copper, aluminum, or the like can be used as a material of the penetrating electrode 34.

Such a TSV technique enables acquisition of signals from the rear surface of the semiconductor chip that is usually not used. Furthermore, since the penetrating electrode 34 vertically passes through the inside of the semiconductor chip 1, the distance between the facing semiconductor chips 1 and the distance between the semiconductor chip 1 and the interposer 5 are reduced so that flexible connection can be attained. The adhesive layer according to the present embodiment can be applied as a sealing material between the facing semiconductor chips 1 and between the semiconductor chip 1 and the interposer 5 in such a TSV technique.

In a bump forming method having high freedom such as an area bump chip technique, the semiconductor chip can be directly packaged on a mother board without an interposer.

The adhesive layer according to the present embodiment can also be applied to such direct packaging of the semiconductor chip on a mother board. The adhesive layer according to the present embodiment can also be applied when a gap between substrates is sealed or filled in a case where two wiring circuit substrates are laminated.

Thermosetting Resin Composition

The adhesive layer can be, for example, a layer formed by a thermosetting resin composition containing a thermosetting resin having a molecular weight of 10000 or less and a curing agent therefor. In other words, the adhesive layer may be a layer containing a thermosetting resin composition containing a thermosetting resin having a molecular weight of 10000 or less and a curing agent therefor.

(a) Thermosetting Resin

The thermosetting resin is a compound that can form a cross-linked structure by heating. The thermosetting resin may have a molecular weight of 10000 or less. When the thermosetting resin composition contains a compound (thermosetting resin) that reacts with the curing agent to form a cross-linked structure, voids generated by decomposition or the like of a component having a small molecular weight at the time of being heated are suppressed, which is advantageous in terms of heat resistance. Examples of the thermosetting resin include an epoxy resin and an acrylic resin.

The weight average molecular weight of the thermosetting resin may be 100 to 9000 or 300 to 7000 from the viewpoint of heat resistance and flowability. The measurement method of the weight average molecular weight of the thermosetting resin is the same as the measurement method of the weight average molecular weight of the (d) polymer component described later.

(a1) Acrylic Resin

The acrylic resin is a compound having one or more (meth)acryloyl groups in the molecule. Examples of the acrylic resin include (meth)acrylates having a skeleton derived from a compound selected from bisphenol A, bisphenol F, naphthalene, phenol novolak, cresol novolak, phenol aralkyl, biphenyl, triphenylmethane, dicyclopentadiene, fluorene, adamantane, and isocyanuric acid, and a (meth)acryloyloxy group; and a variety of polyfunctional (meth)acrylic compounds. From the viewpoint of heat resistance, the acrylic resin may be selected from (meth)acrylates having a skeleton derived from a compound selected from bisphenol A, bisphenol F, naphthalene, fluorene, adamantane, and isocyanuric acid. The acrylic resin can be used singly or in combination of two or more kinds thereof.

The content of the acrylic resin may be 10 to 50 parts by mass or 15 to 40 parts by mass with respect to 100 parts by mass of the total amount of the thermosetting resin composition. When the content of the acrylic resin is 10% by mass or more, the curing component sufficiently exists and thus the flowing of the thermosetting resin composition after being cured is easily controlled. When the acrylic resin is 50% by mass or less, the warpage of a package caused by excessive hardness of a cured material can be further suppressed.

The acrylic resin may be solid at room temperature (25° C.). The solid acrylic resin is more advantageous than a liquid one in that voids are less likely to be generated, the viscosity (tackiness) of the thermosetting resin composition before being cured (B stage) is small, which provides excellent handling properties. Examples of the acrylic resin that is solid at room temperature (25° C.) include (meth) acrylates having a skeleton derived from a compound selected from bisphenol A, fluorene, adamantane, and isocyanuric acid.

The number of (meth)acryloyl groups (the number of functional groups) in the acrylic resin may be 3 or less. When the number of functional groups is 3 or less, the thermosetting resin composition can be sufficiently cured in a short time and thus a decrease in the curing reaction rate can be further suppressed. When the curing reaction rate is low, unreacted groups may remain.

(a2) Epoxy Resin

The epoxy resin is a compound having two or more epoxy groups in the molecule. Examples of the epoxy resin include bisphenol A type epoxy resins, bisphenol F type epoxy resins, naphthalene type epoxy resins, phenol novolak type epoxy resins, cresol novolak type epoxy resins, phenol aralkyl type epoxy resins, biphenyl type epoxy resins, triphenylmethane type epoxy resins, dicyclopentadiene type epoxy resins, and a variety of polyfunctional epoxy resins. From the viewpoint of heat resistance and handling properties, the epoxy resin may be selected from bisphenol F type epoxy resins, phenol novolak type epoxy resins, cresol novolak type epoxy resins, biphenyl type epoxy resins, and triphenylmethane type epoxy resins. The epoxy resin can be used singly or in combination of two or more kinds thereof.

The content of the epoxy resin may be 10 to 50 parts by mass with respect to 100 parts by mass of the total amount of the thermosetting resin composition. When the content of the epoxy resin is 10 parts by mass or more, the curing component sufficiently exists and thus the flowing of the thermosetting resin composition after being cured is easily controlled. When the content of the epoxy resin is 50 parts by mass or less, the warpage of a package caused by excessive hardness of a cured material can be further suppressed.

(b) Curing Agent

The curing agent is a compound that reacts with the thermosetting resin to form a cross-linked structure together with the thermosetting resin. Examples of the curing agent include phenol resin-based curing agents, acid anhydride-based curing agents, amine-based curing agents, imidazole-based curing agents, phosphine-based curing agents, azo compounds, and organic peroxides. The curing reaction (curing system) may be radical polymerization (radical polymerization system). The curing agent can be used singly or in combination of two or more kinds thereof. The phenol resin-based curing agent, the acid anhydride-based curing agent, and the amine-based curing agent each can be used singly or as a mixture of two or more kinds thereof. The imidazole-based curing agent and the phosphine-based curing agent each may be used singly, or may be used together with the phenol resin-based curing agent, the acid anhydride-based curing agent, or the amine-based curing agent.

The combination of the thermosetting resin and the curing agent is not particularly limited as long as curing progresses. The curing agent combined with the acrylic resin may be an organic peroxide from the viewpoint of handling properties and storage stability. The curing agent combined with the epoxy resin may be selected from a phenol resin-based curing agent and an imidazole-based curing agent, an acid anhydride-based curing agent and an imidazole-based curing agent, an amine-based curing agent and an imidazole-based curing agent, and an imidazole-based curing agent singly, from the viewpoint of being excellent in handling properties, storage stability, and curability. Since productivity is improved when curing is performed in a short time, the imidazole-based curing agent, which is excellent in rapid curability and storage stability, may be used singly. When the thermosetting resin composition is cured in a short time, the amount of volatile components such as low-molecularweight components can be reduced and thus generation of voids can be further suppressed. The curing agent combined with the acrylic resin may be an organic peroxide or an azo compound from the viewpoint of handling properties and storage stability.

(b1) Phenol Resin-Based Curing Agent

The phenol resin-based curing agent has two or more phenolic hydroxyl groups in the molecule. Examples of the phenol resin-based curing agent include phenol novolak resins, cresol novolak resins, phenol aralkyl resins, cresol naphthol formaldehyde polycondensates, triphenylmethane type polyfunctional phenol resins, and various polyfunctional phenol resins. These can be used singly or in combination of two or more kinds thereof.

The equivalent ratio of the phenol resin-based curing agent to the epoxy resin (phenolic hydroxyl group/epoxy group, molar ratio) may be 0.3 to 1.5, 0.4 to 1.0, or 0.5 to 1.0 from the viewpoint of being excellent in curability, adhesiveness, and storage stability. When the equivalent ratio is 0.3 or more, there is a tendency that curability is improved so as to further improve the adhesive force. When the equivalent ratio is 1.5 or less, there is a tendency that a non-reacted phenolic hydroxyl group does not excessively remain and a moisture absorbing rate is suppressed to be low, thereby further improving insulation reliability.

(b2) Acid Anhydride-Based Curing Agent

Examples of the acid anhydride-based curing agent include methylcyclohexane tetracarboxylic dianhydride, trimellitic anhydride, pyromellitic anhydride, benzophenone tetracarboxylic dianhydride, and ethylene glycol bisanhydrotrimellitate. These can be used singly or in combination of two or more kinds thereof.

The equivalent ratio of the acid anhydride-based curing agent to the epoxy resin (acid anhydride group/epoxy group, molar ratio) may be 0.3 to 1.5, 0.4 to 1.0, or 0.5 to 1.0 from the viewpoint of being excellent in curability, adhesiveness, and storage stability. When the equivalent ratio is 0.3 or more, there is a tendency that curability is improved so as to further improve the adhesive force. When the equivalent ratio is 1.5 or less, there is a tendency that a non-reacted acid anhydride is difficult to excessively remain and a moisture absorbing rate is suppressed to be low, thereby further improving insulation reliability.

(b3) Amine-Based Curing Agent

Examples of the amine-based curing agent include dicyandiamide and dodecanediamide. These can be used singly or in combination of two or more kinds thereof.

The equivalent ratio of the amine-based curing agent to the epoxy resin (the number of active hydrogens of the amino group/epoxy group, molar ratio) may be 0.3 to 1.5, 0.4 to 1.0, or 0.5 to 1.0 from the viewpoint of being excellent in curability, adhesiveness and storage stability. When the equivalent ratio is 0.3 or more, there is a tendency that curability is improved so as to further improve the adhesive force. When the equivalent ratio is 1.5 or less, insulation reliability tends to be improved since a non-reacted amine is difficult to excessively remain.

(b4) Imidazole-Based Curing Agent

Examples of the imidazole-based curing agent include 2-phenylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adducts, 2-phenylimidazole isocyanuric acid adducts, 2-phenyl-4,5-dihydroxymethylimidazole, 2-phenyl-4-methyl-5-hydroxymethylimidazole, and adducts of epoxy resins and imidazoles. From the viewpoint of being excellent in curability, storage stability, and connection reliability, the imidazole-based curing agent may be selected from 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adducts, 2-phenylimidazole isocyanuric acid adducts, 2-phenyl-4,5-dihydroxymethylimidazole, and 2-phenyl-4-methyl-5-hydroxymethylimidazole. These can be used singly or in combination of two or more kinds thereof. Further, these may also be used as a microcapsulized latent curing agent.

The content of the imidazole-based curing agent may be 0.1 to 20 parts by mass, or 0.1 to 10 parts by mass with respect to 100 parts by mass of the epoxy resin. When the content thereof is 0.1 part by mass or more, curability tends to be improved. When the content thereof is 20 parts by mass or less, failed connection tends to hardly occur since the thermosetting resin composition is difficult to cure before metal bonding is formed.

(b5) Phosphine-Based Curing Agent

Examples of the phosphine-based curing agent include triphenylphosphine, tetraphenylphosphonium tetraphenylborate, tetraphenylphosphonium tetra(4-methylphenyl)borate, and tetraphenylphosphonium (4-fluorophenyl)borate. These can be used singly or in combination of two or more kinds thereof.

The content of the phosphine-based curing agent may be 0.1 to 10 parts by mass, or 0.1 to 5 parts by mass with respect to 100 parts by mass of the epoxy resin. When the content thereof is 0.1 part by mass or more, curability tends to be improved. When the content thereof is 10 parts by mass or less, failed connection tends to hardly occur since the thermosetting resin composition is difficult to cure before metal bonding is formed.

(b6) Azo Compound

Examples of the azo compound include dimethylaminoazobenzene, dimethylaminoazobenzene-carboxylic acid, diethylaminoazobenzene, and diethylaminoazobenzene-carboxylic acid. The azo compound can be used singly or in combination of two or more kinds thereof.

The content of the azo compound may be 0.5 to 10 parts by mass or 1 to 5 parts by mass with respect to 100 parts by mass of the acrylic resin. When the content thereof is 0.5 parts by mass or more, curability tends to be improved. When the content thereof is 10 parts by mass or less, failed connection tends to hardly occur since the thermosetting resin composition is difficult to cure before metal bonding is formed.

(b7) Organic Peroxide

Examples of the organic peroxide include ketone peroxide, peroxy ketal, hydroperoxide, dialkyl peroxide, diacyl peroxide, peroxy dicarbonate, and peroxy ester. The organic peroxide may be one or more selected from hydroperoxide, dialkyl peroxide, and peroxy ester from the viewpoint of storage stability. The organic peroxide may be one or more selected from hydroperoxide and dialkyl peroxide from the viewpoint of heat resistance. These can be used singly or in combination of two or more kinds thereof.

The content of the organic peroxide is preferably 0.5 to 10 parts by mass and more preferably 1 to 5 parts by mass with respect to 100 parts by mass of the acrylic resin. When the content thereof is 0.5 parts by mass or more, curability tends to be improved. When the content thereof is 10 parts by mass or less, failed connection tends to hardly occur since the thermosetting resin composition is difficult to cure before metal bonding is formed. Further, when the content thereof is properly small, since curing rapidly progresses to increase the number of reactive sites, a decrease in reliability caused by shortening of a molecule chain or remaining of unreacted groups is less likely to occur.

(c) Polymer Component

The thermosetting resin composition according to the present embodiment may further contain a polymer component having a weight average molecular weight of 10000 or more. The weight average molecular weight or the molecular weight of components other than the polymer component, such as a thermosetting resin and a curing agent, is typically less than 10000. Examples of the polymer component include epoxy resins, phenoxy resins, polyimide resins, polyamide resins, polycarbodiimide resins, cyanate ester resins, acrylic resins, polyester resins, polyethylene resins, polyethersulfone resins, polyether imide resins, polyvinyl acetal resins, urethane resins, and acrylic rubbers. From the viewpoint of being excellent in heat resistance and film forming properties, the polymer component may be selected from epoxy resins, phenoxy resins, polyimide resins, acrylic resins, acrylic rubbers, cyanate ester resins, and polycarbodiimide resins. From the viewpoint of having further excellent heat resistance and film forming properties, the polymer component may be selected from epoxy resins, phenoxy resins, polyimide resins, acrylic resins, and acrylic rubbers. These polymer components can be used singly or in combination of two or more kinds thereof.

The mass ratio between the polymer component and the acrylic resin is not particularly limited. The content of the acrylic resin may be 0.01 to 10 parts by mass, 0.05 to 5 parts by mass, or 0.1 to 5 parts by mass with respect to 1 part by mass of the polymer component. When the mass ratio is 0.01 part by mass or more, there is a tendency that curability is improved to further improve the adhesive force. When the mass ratio is 10 parts by mass or less, the film forming properties of the thermosetting resin composition tend to be particularly excellent.

The mass ratio between the polymer component and the epoxy resin is not particularly limited. The content of the epoxy resin may be 0.01 to 5 parts by mass, 0.05 to 4 parts by mass, or 0.1 to 3 parts by mass with respect to 1 part by mass of the polymer component. When the mass ratio is 0.01 part by mass or more, there is a tendency that curability is improved to further improve the adhesive force. When the mass ratio is 5 parts by mass or less, the film forming properties and the membrane forming properties of the thermosetting resin composition tend to be particularly excellent.

The glass transition temperature (Tg) of the polymer component may be 120° C. or lower, 100° C. or lower, or 85° C. or lower from the viewpoint of excellent adhesion of the thermosetting resin composition to the substrate and the chip. The Tg of the polymer component may be 0° C. or higher. When the Tg of the polymer component is 120° C. or lower, the thermosetting resin composition can easily embed the height difference of bumps formed on the semiconductor chip, and electrodes or circuit patterns formed on the substrate, and thus there is a tendency that remaining of air bubbles is suppressed so that voids are less likely to be generated. In this specification, the Tg means a value obtained by differential scanning calorimetry using DSC (manufactured by PerkinElmer Co., Ltd., DSC-7 type) under the conditions including a sample amount of 10 mg, a temperature increasing rate of 10° C./min, and a measurement atmosphere of air.

The weight average molecular weight of the polymer component may be 10000 or more in terms of polystyrene, and in order to independently exhibit favorable film forming properties, the weight average molecular weight thereof may be 30000 or more, 40000 or more, or 50000 or more. In this specification, the weight average molecular weight means a weight average molecular weight in terms of polystyrene obtained by measurement using high-performance liquid chromatography (manufactured by SHIMADZU CORPORATION, C-R4A).

(d) Filler

The thermosetting resin composition according to the present embodiment may further contain a filler in order to control the viscosity and the physical properties of the cured material, and in order to further suppress the generation of the voids when the semiconductor chip and the substrate are connected, and a moisture absorption rate. Examples of the filler include an inorganic filler and a resin filler. Examples of the inorganic filler include insulating inorganic fillers made of glass, silica, alumina, titanium oxide, carbon black, mica, boron nitride, and the like. From the viewpoint of handling properties, the inorganic filler may be selected from silica, alumina, titanium oxide, and boron nitride, and from the viewpoint of formation uniformity (handling properties), the inorganic filler may be selected from silica, alumina, and boron nitride. The insulating inorganic filler may be a whisker. Examples of the whisker include aluminum borate, aluminum titanate, zinc oxide, calcium silicate, magnesium sulfate, and boron nitride. Examples of the resin filler include polyurethane, polyimide, methyl methacrylate resin, and methyl methacrylate-butadiene-styrene copolymer resin (MBS). The filler can be used singly or in combination of two or more kinds thereof. The shape, the particle size, and the content of the filler are not particularly limited.

From the viewpoint of having excellent insulation reliability, the filler has insulation properties. The thermosetting resin composition according to the present embodiment may not substantially contain a conductive metal filler such as a silver filler or a solder filler. For example, the content of the conductive metal filler may be less than 1% by mass on the basis of the whole solid content (components other than the solvent) of the thermosetting resin composition.

The physical properties of the filler may be properly adjusted by a surface treatment. From the viewpoint of dispersibility and improvement in adhesive force, the filler may be a filler subjected to a surface treatment. Examples of a surface treatment agent include glycidyl-based (epoxy-based), amine-based, phenyl-based, phenylamino-based, (meth)acrylic-based, and vinyl-based compounds.

As the surface treatment, from the ease of the surface treatment, a silane treatment using a silane compound such as an epoxysilane-based, aminosilane-based, or acrylic silane-based compound is preferable. The surface treatment agent may be a compound selected from glycidyl-based, phenylamino-based, acrylic-based, and methacrylic-based compounds from the viewpoint of having excellent dispersibility, flowability, and adhesive force. From the viewpoint of storage stability, the surface treatment agent may be a compound selected from phenyl-based, acrylic-based, and methacrylic-based compounds.

The average particle size of the filler may be 1.5 μm or less from the viewpoint of preventing the biting at the time of flip chip connection. The average particle size of the filler may be 1.0 μm or less from the viewpoint of having excellent visibility (transparency). The particle size of the filler means a major axis diameter of the particle.

The resin filler can provide flexibility at a high temperature such as 260° C. as compared to the inorganic filler and thus the resin filler is suitable for improving reflow resistance. Further, the resin filler can provide flexibility and thus the resin filler also contributes to improvement in film forming properties of the thermosetting resin composition.

The content of the filler may be 30 to 90% by mass or 40 to 80% by mass on the basis of the whole solid content (components other than the solvent) of the thermosetting resin composition. When the content thereof is 30% by mass or more, heat dissipation properties of the thermosetting resin composition are enhanced and the generation of voids and the moisture absorption rate can be further suppressed. When the content thereof is 90% by mass or less, a decrease in flowability of the thermosetting resin composition caused by high viscosity and the biting (trapping) of the filler to the connection portion can be suppressed and thus connection reliability tends to be further improved.

(e) Fluxing Agent

The thermosetting resin composition according to the present embodiment may further contain a fluxing agent (that is, a fluxing active agent exhibiting fluxing activity (activity for removing oxides or impurities)). Examples of the fluxing agent include nitrogen-containing compounds having unshared electron pairs (imidazole, amines, and the like), carboxylic acids, phenols, and alcohols. Organic acids (carboxylic acids such as 2-methyl glutaric acid, and the like) strongly exhibit fluxing activity as compared to alcohols and the like, which can further improve connectivity and stability.

The content of the fluxing agent may be 0.005 to 10.0% by mass or 0.005 to 0.05% by mass on the basis of the whole solid content (components other than the solvent) of the thermosetting resin composition.

The thermosetting resin composition according to the present embodiment may further contain an additive such as an ion trapper, an antioxidant, a silane coupling agent, a titanium coupling agent, or a leveling agent. The additive can be used singly or in combination of two or more kinds thereof. The content of the additive may be properly adjusted to exhibit the effects of the respective additives.

The curing reaction rate when the thermosetting resin composition according to the present embodiment is held at 200° C. for 5 seconds may be 80% or more or 90% or more. When the curing reaction rate of the thermosetting resin composition when held for 5 seconds at 200° C., which is a temperature equal to or lower than a solder melting temperature, is 80% or more, there is a tendency that solder is less likely to scatter and flow at a temperature during connection equal to or higher than the solder melting temperature and connection reliability and insulation reliability are further improved. The curing reaction rate can be obtained by putting 10 mg of an uncured and thermally-treated thermosetting resin composition (film adhesive) into an aluminum pan, and then performing differential scanning calorimetry to the thermosetting resin composition at a temperature increasing rate 20° C./min in a temperature range of 30 to 300° C. using DSC (manufactured by PerkinElmer Co., Ltd., DSC-7 type). For example, the curing reaction rate is calculated by the following equation when the calorific value ΔH (J/g) of an untreated sample in differential scanning calorimetry is designated as "ΔH1" and the calorific value ΔH (J/g) of the sample after being thermally treated on a hot plate at 200° C./5 sec is designated as "ΔH2."

Curing reaction rate (%)=(ΔH1−ΔH2)/ΔH1×100

In a case where the curing reaction (curing system) of the thermosetting resin composition is radical polymerization, if the thermosetting resin composition contains an anionic polymerizable epoxy resin (particularly, an epoxy resin having a weight average molecular weight of less than 10000), it may be difficult to adjust the curing reaction rate to 80% or more. In a case where the thermosetting resin composition contains an acrylic resin and an epoxy resin, the content of the epoxy resin may be 20 parts by mass or less with respect to 80 parts by mass of the acrylic resin.

The thermosetting resin composition according to the present embodiment can be used in press-bonding at a high temperature of 200° C. or higher. Further, in a flip chip package in which a metal such as solder is melted to form connection, further excellent curability is exhibited.

The adhesive layer according to the present embodiment may be a layer formed by an adhesive film which is prepared in advance from the viewpoint of improving productivity. An example of the method for producing an adhesive film will be described below.

First, as necessary, a thermosetting resin, a curing agent, a polymer component, a filler, other additives, and the like are added into an organic solvent, and are then dissolved or dispersed by stirring and mixing, kneading, or the like to prepare a resin varnish. Subsequently, the resin varnish is applied onto a base film subjected to a releasing treatment using a knife coater, a roll coater, an applicator, a die coater, a comma coater, or the like, and the organic solvent is then decreased by heating to form an adhesive film on the base film. An adhesive film may be formed on a wafer by a method of applying a resin varnish onto the wafer and the like by spin coating to form a film, and then drying a solvent before decreasing the organic solvent by heating.

The base film is not particularly limited as long as it has heat resistance to endure a heating condition during volatilization of the organic solvent, and examples thereof include a polyester film, a polypropylene film, a polyethylene terephthalate film, a polyimide film, a polyether imide film, a polyether naphthalate film, and a methylpentene film. The base film is not limited to a single layer composed of one of these films, and may be a multi-layer film composed of two or more films.

As a condition when the organic solvent is volatized from the applied resin varnish, for example, heating may be performed at 50 to 200° C. for 0.1 to 90 minutes. A heating condition that the organic solvent is volatized to 1.5% or less may be used as long as the volatilization of the organic solvent does not affect voids after packaging or viscosity adjustment.

Adhesive for Semiconductor

The adhesive for a semiconductor according to an embodiment contains (a') a resin component having a weight average molecular weight of less than 10000, (b) a curing agent, and (f) a silanol compound represented by the following General Formula (1):

$$R^1\text{-}R^2\text{—}Si(OH)_3 \quad (1)$$

In the formula, $R^1$ represents an alkyl group, a phenyl group, or a group formed of a combination thereof, and $R^2$ represents an alkylene group. This adhesive for a semiconductor may be used as the thermosetting resin composition for forming an adhesive layer in the method for manufacturing a semiconductor device.

The adhesive for a semiconductor according to the present embodiment may further contain (c) a polymer component having a weight average molecular weight of 10000 or more, a fluxing agent, a filler, and the like. Hereinafter, respective components will be described.

(a') Resin Component Having Weight Average Molecular Weight of Less than 10000

The (a') resin component having a weight average molecular weight of less than 10000 is not particularly limited, but may be a compound (thermosetting resin) that reacts with the (b) curing agent. A component having a small weight average molecular weight may be, for example, decomposed at the time of being heated to cause voids, but reaction of the component with the curing agent makes it easy to secure high heat resistance. Examples of the resin component having a weight average molecular weight of less than 10000 include epoxy resins and acrylic resins. In a case where the (a') resin component having a weight average molecular weight of less than 10000 is a thermosetting resin, the (a') resin component can be the same embodiment as the aforementioned "(a) thermosetting resin."

The (d) curing agent and the other embodiments related to the semiconductor adhesive can be the same embodiment as the aforementioned "(d) curing agent" and the other embodiments related to the thermosetting resin composition.

(f) Silanol Compound

The silanol compound represented by the above General Formula (1) may be solid at 25° C. from the viewpoint of heat resistance. $R^1$ in Formula (1) may be an alkyl group or a phenyl group from the viewpoint of heat resistance and flowability. $R^1$ may be a group formed of a combination of an alkyl group and a phenyl group (an alkyl-substituted phenyl group or a phenylalkyl group). Examples of the group represented as $R^1$ include a phenyl group, a propyl group, a phenylpropyl group, and a phenylmethyl group. $R^2$ in Formula (1) is not particularly limited, but may be an alkylene group having a weight average molecular weight of 100 to 5000 from the viewpoint of heat resistance. The silanol compound in which $R^2$ is an alkylene group having a weight average molecular weight of 100 to 5000 has typically a weight average molecular weight in a range of about 100 to 5000. From the viewpoint of high reactivity (strength of a cured material), the silanol compound may be a trifunctional silanol.

By adding the (f) silanol compound to the adhesive for a semiconductor, flowability is improved and void suppression and high connectivity are further improved. When flowability is improved (the viscosity is decreased), voids entrained at the time of chip contact are easily removed. The (f) silanol compound has high heat resistance and the thermal weight loss amount thereof is small. When the silanol compound having high heat resistance is used, the generation of voids can be further suppressed. When the thermal weight loss amount is small, the amount of volatile components is small and thus voids are decreased and reliability (reflow resistance) is further improved.

The content of the (f) silanol compound may be 2 to 20% by mass on the basis of the total amount of the adhesive for a semiconductor (components other than the solvent), and may be 2 to 10% by mass or 2 to 9% by mass from the viewpoint of high flowability and the strength of a cured material (adhesive force or the like). When the content thereof is 2% by mass or more, a significant effect is easily exhibited in terms of high flowability. When the content thereof is 20% by mass or less, the strength after curing is increased so that particularly high adhesive force tends to be exhibited. When the content of the (f) silanol compound is small to some extent, the proportion of the cured material of the epoxy resin or the acrylic resin is increased and thus higher adhesive force is assumed to be exhibited.

The adhesive for a semiconductor may be a film, that is, may be an adhesive film. The film semiconductor adhesive can be produced in the same manner as in the aforementioned example of the method for producing an adhesive film, except that the resin varnish contains the (f) silanol compound.

The adhesive for a semiconductor according to the present embodiment is suitably used particularly in sealing the connection portions, for example, in a semiconductor device in which connection portions of a semiconductor chip and a wiring circuit substrate are electrically connected to each other or in a semiconductor device in which connection portions of a plurality of semiconductor chips are electrically connected to each other.

Semiconductor devices using the adhesive for a semiconductor according to the present embodiment will be described. A connection portion in the semiconductor device may be any of metal bonding between a bump and a circuit and metal bonding between a bump and a bump. In the semiconductor device, for example, flip chip connection in which electric connection is obtained through the adhesive for a semiconductor may be used. Examples of the semiconductor device are as illustrated in FIGS. 4 to 7. The connection is conducted between the bump and the bump, between the bump and the pad, and between the bump and the circuit which are described above.

The method for manufacturing a semiconductor device according to the present embodiment may include connecting a semiconductor chip and a wiring circuit substrate or a plurality of semiconductor chips to each other by using the adhesive for a semiconductor according to the present embodiment. The method for manufacturing a semiconductor device according to the present embodiment includes, for example, a step of connecting a semiconductor chip and a wiring circuit substrate to each other through the adhesive for a semiconductor and electrically connecting connection portions of the semiconductor chip and the wiring circuit substrate to each other to obtain a semiconductor device, or a step of connecting a plurality of semiconductor chips to each other through the adhesive for a semiconductor and electrically connecting connection portions of the plurality of semiconductor chips to each other to obtain a semiconductor device.

In the method for manufacturing a semiconductor device according to the present embodiment, the connection portions can be connected to each other by metal bonding. That is, the connection portions of the semiconductor chip and the wiring circuit substrate are connected to each other by metal bonding, or the connection portions of the plurality of semiconductor chips are connected to each other by metal bonding.

The adhesive for a semiconductor according to the present embodiment can be used as the thermosetting resin composition in the aforementioned semiconductor device according to the first, second, or third embodiment. Since the adhesive for a semiconductor according to the present embodiment has high flowability at a high temperature, the adhesive for a semiconductor according to the present embodiment is particularly useful in the third embodiment using a heating furnace or a hot plate as a heating apparatus for the main press-bonding.

Figure 8:
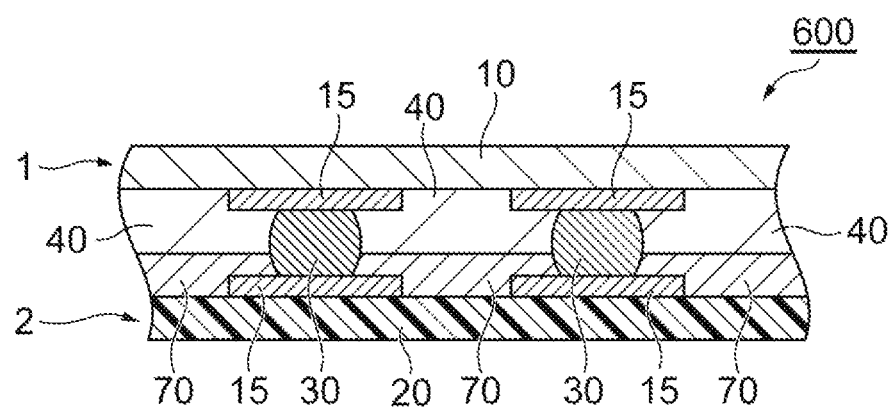
FIG. 8 is a schematic cross-sectional view illustrating still another embodiment of a semiconductor device.

As another example of the method for manufacturing a semiconductor device using the adhesive for a semiconductor according to the present embodiment, a method for manufacturing a semiconductor device 600 according to an embodiment illustrated in FIG. 8 will be described. In the semiconductor device 600, a substrate (for example, a glass epoxy substrate) 2 having a substrate main body 20 and circuits (copper circuits) 15 as connection portions and a semiconductor chip 1 having a semiconductor chip main body 10 and circuits (for example, copper pillars or copper posts) 15 and bumps 30 (connection bumps or solder bumps) as connection portions are connected to each other through an adhesive layer 40 formed from an adhesive for a semiconductor. The circuits 15 of the semiconductor chip 1 and the circuits 15 of the substrate 2 are electrically connected by the bumps 30 (connection bumps or solder bumps). A solder resist 70 is disposed on the surface on which the circuits 15 are formed in the substrate main body 20, except for the positions where the bumps 30 are formed. Gold plating is conducted to the circuits 15 in the substrate 2. The metal of the connection portion is solder (tin-silver)-gold, and if solder having a low melting point reaches the melting point or higher, connection can be realized. The semiconductor device 600 may be a semiconductor device in which semiconductor chips are connected to each other. That is, instead of the substrate 2, another semiconductor chip may be connected to the semiconductor chip 1.

In the method for manufacturing the semiconductor device 600, first, an adhesive for a semiconductor (a film adhesive or the like) as the adhesive layer 40 is attached onto the substrate 2 on which the solder resist 70 is formed. The adhesive for a semiconductor can be attached by heat press, roll lamination, vacuum lamination, or the like. The applied area and thickness of the adhesive layer 40 are properly set according to the size of the semiconductor chip 1 or the substrate 2, or the like. The adhesive layer 40 may be attached to the semiconductor chip 1, or the adhesive for a semiconductor according to the present embodiment may be attached to a semiconductor wafer, and then the semiconductor wafer may be singulated to the semiconductor chip 1 by dicing to prepare the semiconductor chip 1 attached with the adhesive layer 40. After the adhesive layer 40 is attached to the substrate 2 or the semiconductor chip 1, the bumps 30 on the circuits 15 of the semiconductor chip 1 and the circuits 15 of the substrate 2 are aligned with a connection apparatus (a press-bonding apparatus) such as a flip chip bonder and then press-bonded (first step, temporary press-bonding). Then, the semiconductor chip 1 and the substrate 2 are heated to a temperature equal to or higher than the melting point of the bump 30 (second step, main press-bonding) to connect the semiconductor chip 1 and the substrate 2 and the gap between the semiconductor chip 1 and the substrate 2 are filled with the adhesive layer 40 such that the connection portions are sealed. The main press-bonding (main connection step, second step) may be performed such that the metal of any one of the connection portions becomes equal to or higher than the melting point. In a case where the bump 30 contains solder, the semiconductor chip 1 and the substrate 2 may be heated such that the temperature of the bump 30 becomes 250° C. or higher.

A connection load of the temporary press-bonding (first step) depends on the number of bumps, but it is set in consideration of the absorption of a variation of the height of the bumps, or the control of the amount of deformation of the bumps. After the temporary press-bonding (first step), the metals of the connection portions between the semiconductor chip 1 and the substrate 2 may be contacted. When the metals of the connection portions are contacted or connected in the first step, since a metallic bond is easily formed after the second step and the biting of the adhesive for a semiconductor is reduced, favorable connectivity is particularly easily obtainable.

In order to contact the metals of the connection portions between the semiconductor chip 1 and the substrate 2 or form a metallic bond while removing voids at the time of the temporary press-bonding (first step), the load can be increased. When the load is large, voids are easily removed and the metals of the connection portions are easily contacted. The load may be, for example, 0.009 N to 0.3 N per 1 pin (1 bump) of the semiconductor chip.

The temporary press-bonding (first step) may be performed in a short time from the viewpoint of an improvement in productivity. For example, the time for the temporary press-bonding may be 5 seconds or shorter, and from the viewpoint of an improvement in productivity, may be 3 seconds or shorter or 2 seconds or shorter.

The temperature of the temporary press-bonding (first step) (the temperature of the press-bonding apparatus) may be set to be low in order not to transfer heat when the semiconductor chip (attached with the adhesive for a semiconductor) is picked up by the press-bonding tool. By setting the temperature of the temporary press-bonding (first step) (the temperature of the press-bonding apparatus), flowability of the adhesive for a semiconductor can be enhanced such that voids at the time of entrainment can be removed. The temperature of the temporary press-bonding (first step) (the temperature of the press-bonding apparatus) may be a temperature lower than the reaction initiation temperature of the adhesive for a semiconductor. In order to shorten the cooling time, a difference between the temperature when the semiconductor chip is picked up by the press-bonding tool and the temperature when the semiconductor chips or the semiconductor chip and the substrate contact to each other (at the time of the temporary press-bonding) may be small. This temperature difference may be 100° C. or lower or 60° C. or lower, and may be constant (the same set temperature). When the temperature difference is 100° C. or lower, the time for cooling the press-bonding tool is shortened and thus productivity is further improved. The reaction initiation temperature is an on-set temperature in differential scanning calorimetry using DSC (manufactured by PerkinElmer Co., Ltd., DSC-Pyirs 1) under the conditions including a sample amount of 10 mg, a temperature increasing rate of 10° C./min, and a measurement atmosphere of air or nitrogen atmosphere.

Regarding the heating temperature in the main press-bonding (second step), a temperature equal to or higher than a melting point of solder needs to be applied to the package. For example, in a case where the metal of the connection portion is solder, the heating temperature is preferably 230° C. or higher and 330° C. or lower. When the heating temperature is low, the metal of the connection portion is not melted and thus a sufficient metallic bond is not formed. When the heating temperature is high, voids are likely to be generated and the solder is likely to be scattered.

The heating temperature in the main press-bonding (main connection step, second step) may be a temperature higher than the reaction initiation temperature of the adhesive for a semiconductor such that the curing of the adhesive for a semiconductor is promoted as well as the formation of the metallic bond. When the curing of the adhesive for a semiconductor is promoted during the main connection step, further void generation and failed connection can be particularly effectively suppressed.

The heating of the main press-bonding (second step) is not particularly limited, but for example, can be performed by using a heating apparatus such as a reflow furnace, an oven, or a hot plate. Examples of the heating apparatus include a reflow furnace (manufactured by TAMURA CORPORATION) and a clean oven (manufactured by ESPEC CORP.).

In the main press-bonding (second step), in the case of a chip-chip connection, a chip-substrate connection, a chip-wafer connection, a wafer-wafer connection, or the like, a weight may be placed thereon or these may be pinched by a clip. According to this, the warpage and failed connection generated by a difference in thermal expansion between the semiconductor chips or between the semiconductor chip and the adhesive for a semiconductor can be more effectively suppressed.

In the case of performing the main connection step (second step) by using a press-bonding machine, heat of the press-bonding machine is less likely to be transferred to the fillet that is the adhesive for a semiconductor protruding on the chip side surface at the time of press-bonding. For this reason, the heating treatment for sufficiently curing the adhesive for a semiconductor of the fillet portion or the like may be necessary after the second step. On the other hand, in the case of performing heating of the main press-bonding (second step) by using a heating furnace such as a reflow furnace or an oven, a hot plate, or the like, heat is applied to the whole body to be heated and thus the heating treatment after the second step can be shortened or omitted.

In the temporary press-bonding (first step), the plurality of chips may be collectively press-bonded. In the stack press-bonding that is often seen in a package having a TSV structure, a plurality of chips are press-bonded in a stereoscopic manner. In this case, after the first step in which a plurality of semiconductor chips are stacked one by one and temporarily press-bonded, the plurality of chips are mainly press-bonded collectively in the second step.

EXAMPLE

Hereinafter, the present invention will be described in more detail by means of Examples. However, the present invention is not limited to the following Examples.

1. Examination Example Mainly Related to First Embodiment 1-1. Preparation of Adhesive Film Compounds used in preparation of adhesive films are described below.

(a) Thermosetting Resin

Acrylic Resin

Ethoxylated isocyanuric acid triacrylate (manufactured by Shin Nakamura Chemical Co., Ltd., A-9300)

Acrylate compound having a fluorene skeleton (manufactured by Osaka Gas Chemicals Co., Ltd., EA0200, the number of functional groups of the acryloyl group: 2)

Epoxy Resin

Polyfunctional solid epoxy resin having a triphenol methane skeleton (manufactured by Japan Epoxy Resin Co., Ltd., EP1032H60)

Bisphenol F type liquid epoxy resin (manufactured by Japan Epoxy Resin Co., Ltd., YL983U)

(b) Curing Agent

Dicumyl peroxide (manufactured by NOF CORPORATION, PERCUMYL D)

2,4-Diamino-6-[2'-methylimidazolyl-(1')]-ethyl-s-triazine isocyanuric acid adduct (manufactured by SHIKOKU CHEMICALS CORPORATION, 2MAOK-PW)

(c) Polymer Component

Phenoxy resin (manufactured by TOHTO Chemical Industry Co., Ltd., ZX1356, Tg: about 71° C., weight average molecular weight: about 63000)

Acrylic rubber (manufactured by Hitachi Chemical Company, Ltd., KH-C865, Tg: 0 to 12° C., weight average molecular weight: 450000 to 650000)

(d) Filler

Inorganic Filler

Silica filler (manufactured by Admatechs Company Limited, SE2050, average particle size: 0.5 μm)

Silica filler surface-treated with epoxysilane (manufactured by Admatechs Company Limited, SE2050SEJ, average particle size: 0.5 μm)

Methacrylic-surface-treated nano silica filler (manufactured by Admatechs Company Limited, YA050CSM, hereinafter, referred to as "SM nano silica," average particle size: about 50 nm)

Resin Filler

Organic filler (manufactured by ROHM AND HAAS JAPAN K. K., EXL-2655: core-shell type organic fine particle)

(e) Fluxing Agent (Carboxylic Acid)

2-Methylglutaric acid (manufactured by Sigma-Aldrich, Inc., melting point: about 77° C., hereinafter, referred to as "glutaric acid")

Production Example 1-1

An acrylic resin (A9300), an inorganic filler (SE2050, SE2050SEJ, and SM nano silica), and a resin filler (EXL2655) at the blended amounts presented in Table 1 (unit: part by mass) were added to methyl ethyl ketone as a solvent such that the concentration of non-volatile content (solid content, components other than the solvent) became 60% by mass. Then, beads (Φ1.0 mm and Φ2.0 mm) were added in an amount equal to the total amount of the acrylic resin and the inorganic filler that were added to methyl ethyl ketone, and the mixture was stirred with a bead mill (manufactured by Fritsch Japan Co., Ltd., planetary pulverizing mill P-7) for 30 minutes. Thereafter, a phenoxy resin (ZX1356) was added as a polymer component, and the mixture was stirred again with the bead mill for 30 minutes. After stirring, a curing agent (PERCUMYL D) was added, the mixture was stirred, and the beads were removed by filtration to obtain varnish. The obtained varnish was applied with a compact precision coating apparatus (manufactured by Yasui Seiki Company, Ltd.) and the coating film was dried in a clean oven (manufactured by ESPEC CORP.) (70° C./10 min) to obtain an adhesive film.

Production Examples 1-2 and 1-3

Adhesive films were obtained in the same manner as in Production Example 1-1, except that the used materials were changed as presented in Table 1. A fluxing agent was added at the same time of adding a thermosetting resin.

TABLE 1

| | | | Production Example | | |
|---|---|---|---|---|---|
| Raw material | | | 1-1 | 1-2 | 1-3 |
| Thermosetting resin | Acrylic resin | A9300 | 60 | — | — |
| | | EA0200 | — | 60 | — |

TABLE 1-continued

| Raw material | | | Production Example | | |
|---|---|---|---|---|---|
| | | | 1-1 | 1-2 | 1-3 |
| | Epoxy resin | EP1032H60 | — | — | 45 |
| | | YL983U | — | — | 15 |
| | Curing agent | PERCUMYL D | 2 | 2 | — |
| | | 2MAOK-PW | — | — | 6 |
| | Polymer component | ZX1356 | 60 | — | 30 |
| | | KH-C865 | — | 30 | — |
| Filler | Inorganic filler | SE2050 | 15 | 15 | 15 |
| | | SE2050SEJ | 15 | 15 | 15 |
| | | SM nano silica | 80 | 80 | 45 |
| | Resin filler | EXL-2655 | 10 | 10 | 10 |
| | Fluxing agent | Glutaric acid | — | — | 4 |

1-2. Manufacturing of Semiconductor Device

Example 1-1

Two pressing members I and II each having a stage and a press-bonding head facing each other (FCB3, manufactured by Panasonic Corporation) were prepared, and a semiconductor device was manufactured according to the following procedures by using the pressing member I as the member for temporary press-bonding and the pressing member II as the pressing member for main press-bonding.

The adhesive film produced in Production Example 1-1 was cut into a size of 8 mm×8 mm×0.045 mmt and was bonded onto a semiconductor chip (chip size: 10 mm×10 mm×0.4 mmt, metal of connection portion: Au, product name: WALTS-TEG IP80, manufactured by WALTS CO., LTD.). Subsequently, the semiconductor chip attached with the adhesive film was fed onto a stage of the pressing member I as the pressing member for temporary press-bonding. The semiconductor chip on the stage and a semiconductor chip with solder bumps (chip size: 7.3 mm×7.3 mm×0.15 mmt, metal of connection portion: copper pillar+solder, bump height: about 45 μm (total of copper pillar+solder), the number of bumps: 1048 pins, pitch of 80 μm, product name: WALTS-TEG CC80, manufactured by WALTS CO., LTD.) were aligned such that the respective connection portions faced to each other. Thereafter, a laminate including the semiconductor chip, the adhesive film, and the semiconductor chip was interposed between the press-bonding head and the stage and then pressured and heated to thereby temporarily press-bond the semiconductor chips to each other. Subsequently, the temporarily press-bonded laminate was heated and pressured by interposing the laminate with the pressing member II as the pressing member for main press-bonding to thereby electrically connect the semiconductor chips to each other.

The temporary press-bonding condition and the main press-bonding condition are described as follows. These conditions were set such that the evaluation of voids and the evaluation of connection of a semiconductor device to be obtained became "A."

Temporary Press-Bonding Condition
Temperature of press-bonding head: 80° C., load: 75 N, stage temperature: 80° C.

Main Press-Bonding Condition
Temperature of press-bonding head: 280° C., load: 75 N, stage temperature: 80° C.

A plurality of semiconductor devices were continuously manufactured while two pressing members I and II were operated in parallel at the same time. The results of the manufacturing time required for the temporary press-bonding and the main press-bonding, the manufacturing time per one semiconductor device package (PKG), and the unit per hour (UPH) of the semiconductor device are presented in Table 2.

1-3. Evaluation (1) Evaluation of Voids

An image of the appearance of the fabricated semiconductor device was taken with an ultrasonic image diagnostic apparatus (Insight-300, manufactured by Insight k.k.) and an image of the adhesive layer on the semiconductor chip was taken with a scanner GT-9300UF (manufactured by Seiko Epson Corporation). The image was subjected to color tone correction and black and white conversion with an image processing software Adobe Photoshop (registered trademark) to distinguish void portions, and the proportion of the void portions in the adhesive layer was calculated based on a histogram. The area of the adhesive layer on the semiconductor chip was regarded as 100%. A case where the area occupied by voids is 10% or less was determined as "A," and a case where the area occupied by voids is more than 10% was determined as "B."

(2) Evaluation of Connection

The connection resistance value of the prepared semiconductor device was measured with a multimeter (manufactured by ADVANTEST CORPORATION, trade name "R6871E") to evaluate initial conduction after mounting. A case where the initial connection resistance value of the inner circumference of the peripheral portion is 45Ω or less and the initial connection resistance value of the outer circumference is 85Ω or less was regarded as "A," and all of a case where the initial connection resistance value of the inner circumference is more than 45Ω, a case where the initial connection resistance value of the outer circumference is more than 85Ω, and a case where conduction does not occur (resistance value not indicated) were regarded as "B."

Comparative Example 1-1

A plurality of semiconductor devices were manufactured using the adhesive film of Production Example 1 according to the following procedure while two pressing members I and II were operated in parallel at the same time under the same press-bonding condition.

The semiconductor chip and the semiconductor chip with bumps were aligned on each stage of the pressing members I and II. Thereafter, while pressuring was performed by the press-bonding head and the stage of the pressing member, the temperature of the press-bonding head was increased to 280° C. for 1 second and then this state was held for 2 seconds. Accordingly, the semiconductor chip and the semiconductor chip with bumps were press-bonded to each other and electrically connected. The total time for press-bonding was 3 seconds. Thereafter, the temperature of the press-bonding head was cooled from 280° C. to 80° C. of the feed temperature of the semiconductor chip. The press-bonding conditions were set such that the evaluation of voids and the evaluation of connection of a semiconductor device became "A."

The results of the manufacturing time required for each stage, the manufacturing time per one semiconductor device package (PKG), and the unit per hour (UPH) of the semiconductor package are presented in Table 2.

TABLE 2

|  | Example 1-1 | | Comparative Example 1-1 | |
|---|---|---|---|---|
|  | Item | Manufacturing time [s] | Item | Manufacturing time [s] |
| Pressing member I | Feeding semiconductor chip to pressing member → Alignment → Temporary press-bonding | 3 | Feeding semiconductor chip to pressing member → Alignment Press-bonding Cooling pressing member | 2<br>3<br>15 |
|  | Total | 3 | Total | 20 |
| Pressing member II | Main press-bonding | 3 | Feeding semiconductor chip to pressing member → Alignment Press-bonding Cooling pressing member | 2<br>3<br>15 |
|  | Total | 3 | Total | 20 |
| Manufacturing time [s] per 1 PKG | | 3 | | 10 |
| UPH [PKG] | | 1200 | | 360 |

Example 1-2

A semiconductor device was manufactured in the same manner as in Example 1, except that the adhesive film of Production Example 1-2 was used. The results are presented in Table 3.

Comparative Example 1-2

A semiconductor device was manufactured in the same manner as in Comparative Example 1, except that the adhesive film of Production Example 1-2 was used. The results are presented in Table 3.

TABLE 3

|  | Example 1-2 | | Comparative Example 1-2 | |
|---|---|---|---|---|
|  | Item | Manufacturing time [s] | Item | Manufacturing time [s] |
| Pressing member I | Feeding semiconductor chip to pressing member → Alignment → Temporary press-bonding | 3 | Feeding semiconductor chip to pressing member → Alignment Press-bonding Cooling pressing member | 2<br>3<br>15 |
|  | Total | 3 | Total | 20 |
| Pressing member II | Main press-bonding | 3 | Feeding semiconductor chip to pressing member → Alignment Press-bonding Cooling pressing member | 2<br>3<br>15 |
|  | Total | 3 | Total | 20 |
| Manufacturing time [s] per 1 PKG | | 3 | | 10 |
| UPH [PKG] | | 1200 | | 360 |

Example 1-3

A semiconductor device was manufactured in the same manner as in Example 1, except that the adhesive film of Production Example 1-3 was used. The results are presented in Table 4.

Comparative Example 1-3

A semiconductor device was manufactured in the same manner as in Comparative Example 1, except that the adhesive film of Production Example 1-3 was used, the temperature of the press-bonding head was increased to 280° C. for 1 second and then held for 4 seconds, and the total time for press-bonding was 5 seconds. The results are presented in Table 4.

TABLE 4

|  | Example 1-3 | | Comparative Example 1-3 | |
|---|---|---|---|---|
|  | Item | Manufacturing time [s] | Item | Manufacturing time [s] |
| Pressing member I | Feeding semiconductor chip to pressing member → Alignment → Temporary press-bonding | 5 | Feeding semiconductor chip to pressing member → Alignment Press-bonding Cooling pressing member | 2<br>5<br>15 |
|  | Total | 5 | Total | 22 |
| Pressing member II | Main press-bonding | 5 | Feeding semiconductor chip to pressing member → Alignment Press-bonding Cooling pressing member | 2<br>5<br>15 |
|  | Total | 5 | Total | 22 |

TABLE 4-continued

| | Example 1-3 | | Comparative Example 1-3 | |
|---|---|---|---|---|
| Item | | Manufacturing time [s] | Item | Manufacturing time [s] |
| Manufacturing time [s] per 1 PKG | | 5 | | 11 |
| UPH [PKG] | | 720 | | 327 |

As clearly seen from the results of Tables 2 to 4, according to the method related to the present embodiment, it is possible to shorten the manufacturing time of the semiconductor device and to increase the unit per hour (UPH) of the semiconductor device.

2. Examination Example Mainly Related to First Embodiment 2-1. Preparation of Adhesive Film Compounds used in preparation of an adhesive film are described below.

(a) Thermosetting Resin
Acrylic Resin
Acrylate having a skeleton derived from fluorene (manufactured by Osaka Gas Chemicals Co., Ltd., EA0200, the number of acryloyl groups: 2)

(b) Curing Agent
Dicumyl peroxide (manufactured by NOF CORPORATION, PERCUMYL D)

(c) Polymer Component
Acrylic rubber (manufactured by Hitachi Chemical Company, Ltd., KH-C865, Tg: 0 to 12° C., weight average molecular weight: 450000 to 650000)

(d) Filler Inorganic Filler
Silica filler (manufactured by Admatechs Company Limited, SE2050, average particle size: 0.5 μm)
Silica filler surface-treated with epoxysilane (manufactured by Admatechs Company Limited, SE2050SEJ, average particle size: 0.5 μm)
Methacrylic-surface-treated nano silica filler (manufactured by Admatechs Company Limited, YA050CSM, hereinafter, referred to as "SM nano silica," average particle size: about 50 nm)
Resin Filler
Organic filler (manufactured by ROHM AND HAAS JAPAN K. K., EXL-2655: core-shell type organic fine particle)

Production Example 2-1

An acrylic resin (A9300), an inorganic filler (SE2050, SE2050SEJ, and SM nano silica), and a resin filler (EXL2655) at the blended amount presented in Table 5 (unit: part by mass) were added to methyl ethyl ketone as a solvent such that the concentration of non-volatile content (solid content, components other than the solvent) became 60% by mass. Then, beads (Φ1.0 mm and Φ2.0 mm) were added in an amount equal to the solid content, and the mixture was stirred with a bead mill (manufactured by Fritsch Japan Co., Ltd., planetary pulverizing mill P-7) for 30 minutes. Thereafter, a phenoxy resin (ZX1356) was added as a polymer component, and the mixture was stirred again with the bead mill for 30 minutes. After stirring, a curing agent (PERCUMYL D) was added, the mixture was stirred, and the beads were removed by filtration to obtain varnish. The obtained varnish was applied with a compact precision coating apparatus (manufactured by Yasui Seiki Company, Ltd.) and the coating film was dried in a clean oven (manufactured by ESPEC CORP.) (70° C./10 min) to obtain an adhesive film.

TABLE 5

| Raw material | | | Production Example 2-1 |
|---|---|---|---|
| Thermosetting resin | Acrylic resin | EA0200 | 60 |
| | Curing agent | PERCUMYL D | 2 |
| | Polymer component | KH-C865 | 30 |
| Filler | Inorganic filler | SE2050 | 15 |
| | | SE2050SEJ | 15 |
| | | SM nano silica | 85 |
| | Resin filler | EXL-2655 | 10 |

The melt viscosity of the obtained adhesive film at the temperature at the time of the temporary press-bonding step was measured by the following method.

Measurement of Melt Viscosity

The melt viscosity at the temperature (° C.) of the press-bonding head at the time of the temporary press-bonding presented in Table 6 was measured with a rheometer (manufactured by Anton Paar Japan K.K., MCR301) by using a measurement jig (a disposable plate (diameter: 8 mm) and a disposable sample dish) under the conditions including a sample thickness of 400 μm, a temperature increasing rate of 10° C./min, and frequency of 1 Hz. The results are presented in Table 6.

2-2. Manufacturing of Semiconductor Device

Example 2-1

Two pressing members I and II each having a stage and a press-bonding head facing each other (FCB3, manufactured by Panasonic Corporation) were prepared, and a semiconductor device was manufactured according to the following procedures by using the pressing member I as the member for temporary press-bonding and the pressing member II as the pressing member for main press-bonding.

The adhesive film produced in Production Example 2-1 was cut into a size of 8 mm×8 mm×0.045 mmt and was bonded onto a semiconductor chip (chip size: 10 mm×10 mm×0.4 mmt, metal of connection portion: Au, product name: WALTS-TEG IP80, manufactured by WALTS CO., LTD.). Subsequently, the semiconductor chip attached with the adhesive film was fed onto a stage of the pressing member I as the pressing member for temporary press-bonding. The semiconductor chip on the stage and a semiconductor chip with solder bumps (chip size: 7.3 mm×7.3 mm×0.15 mmt, metal of connection portion: copper pillar+ solder, bump height: about 45 μm (total of copper pillar+ solder), the number of bumps: 1048 pins, pitch of 80 μm, product name: WALTS-TEG CC80, manufactured by WALTS CO., LTD.) were aligned such that the respective connection portions faced to each other. Thereafter, a laminate including the semiconductor chip, the adhesive film, and the semiconductor chip was interposed between the press-bonding head and the stage and then pressured and heated to thereby temporarily press-bond the semiconductor chips to each other such that the connection portions were contacted to each other. Subsequently, the temporarily press-bonded laminate was heated and pressured by being interposed with the pressing member II as the pressing member for main press-bonding to thereby electrically connect the semiconductor chips to each other. The temporary press-bonding condition and the main press-bonding condition are presented as in Table 6. In both the temporary press-bonding and the main press-bonding, the stage temperature was 80° C. and the press-bonding time was 2 seconds.

Examples 2-2 to 2-8

Semiconductor devices of Examples 2-2 to 2-8 were manufactured in the same manner as in Example 2-1, except that the temperature of the press-bonding head and the load in the temporary press-bonding step and the main press-bonding step were changed as presented in Table 2.

2-3. Evaluation

The evaluation of voids and the evaluation of connection of the obtained semiconductor devices were conducted.

Evaluation of Voids

An image of the appearance of the obtained semiconductor device was taken with an ultrasonic image diagnostic apparatus (Insight-300, manufactured by Insight k.k.) and an image of the adhesive layer on the semiconductor chip was taken with a scanner GT-9300UF (manufactured by Seiko Epson Corporation). The image was subjected to color tone correction and black and white conversion with an image processing software Adobe Photoshop (registered trademark) to distinguish void portions, and the proportion of the void portions in the adhesive layer was calculated based on a histogram. The area of the adhesive layer on the semiconductor chip was regarded as 100%. A case where the area occupied by voids is 5% or less was evaluated as "A," and a case where the area occupied by voids is more than 5% was evaluated as "B." The results are presented in Table 6.

Evaluation of Connection

The connection resistance value of the prepared semiconductor device was measured with a multimeter (manufactured by ADVANTEST CORPORATION, trade name "R6871E") to evaluate conduction after the temporary press-bonding step and after the main press-bonding step. Regarding cases after the temporary press-bonding step, the case of conduction at the peripheral portion (resistance value indicated) was regarded as "A," and the case of no conduction (resistance value not indicated) were regarded as "B." Regarding cases after the main press-bonding step, a case where the initial connection resistance value of the inner circumference of the peripheral portion is 45Ω or less and the initial connection resistance value of the outer circumference is 85Ω or less was regarded as "A," and all of a case where the initial connection resistance value of the inner circumference is more than 45Ω, a case where the initial connection resistance value of the outer circumference is more than 85Ω, and a case where conduction does not occur (resistance value not indicated) were regarded as "B." The results are presented in Table 6.

TABLE 6

| | | | Example | | | | | | | |
|---|---|---|---|---|---|---|---|---|---|---|
| | | | 2-1 | 2-2 | 2-3 | 2-4 | 2-5 | 2-6 | 2-7 | 2-8 |
| Packaging condition | Temporary press-bonding step | Load [N] | 100 | 100 | 75 | 100 | 100 | 75 | 100 | 100 |
| | | Press-bonding head temperature [° C.] | 100 | 100 | 130 | 130 | 130 | 80 | 80 | 80 |
| | Connection step | Load [N] | 75 | 75 | 75 | 75 | 75 | 75 | 75 | 75 |
| | | Press-bonding head temperature [° C.] | 240 | 260 | 260 | 240 | 260 | 260 | 240 | 260 |
| Evaluation | Adhesive film | Melt viscosity [Pa·s] | 6730 | 6730 | 4830 | 4830 | 4830 | 11200 | 11200 | 11200 |
| | After temporary press-bonding step | Connectivity | A | A | A | A | A | B | B | B |
| | After heating step | Void | A | A | A | A | A | B | B | B |
| | | Connectivity | A | A | A | A | A | B | B | B |

From the comparison of Examples 2-1 to 2-5 and Examples 2-6 to 2-8 in Table 6, it was confirmed that the fact that the melt viscosity of the adhesive layer is 7000 Pa·s or less at the temperature of the press-bonding head at the time of the temporary press-bonding step contributes to suppression of generation of voids and improvement in reliability of the semiconductor device.

3. Examination Example Mainly Related to Second Embodiment 3-1. Raw Material

A sheet for collective connection used in Examples is described below.

NITOFLON 900UL (Nitto Denko Corporation, thickness: 50 μm, 100 μm)

UPILEX SGA (Ube Industries, Ltd., 50 μm, 100 μm (50 μm×2))

Aluminum foil (Sumikei Aluminum Foil Co., Ltd., 100 μm (20 μm×5))

Compounds used in Examples are described below.
(a) Thermosetting Resin
Epoxy Resin Polyfunctional solid epoxy resin having a triphenol methane skeleton (EP1032H60, Japan Epoxy Resin Co., Ltd., weight average molecular weight: 800 to 2000)

Bisphenol F type liquid epoxy resin (YL983U, Japan Epoxy Resin Co., Ltd., molecular weight: about 336)

Flexible semisolid epoxy resin (YL7175-1000, Japan Epoxy Resin Co., Ltd., weight average molecular weight: 1000 to 5000)
Acrylic Resin Acrylate resin having a fluorene skeleton (EA0200, Osaka Gas Chemicals Co., Ltd., two functional groups, molecular weight: about 546)

(b) Curing Agent 2,4-Diamino-6-[2'-methylimidazolyl-(1')]-ethyl-s-triazine isocyanuric acid adduct (2MAOK-PW, manufactured by SHIKOKU CHEMICALS CORPORATION)

Dicumyl peroxide (PERCUMYL D, NOF CORPORATION)

(c) Polymer Component

Phenoxy resin (ZX1356-2, TOHTO Chemical Industry Co., Ltd., Tg: about 71° C., weight average molecular weight: about 63000)

Acrylic rubber (KH-C865, manufactured by Hitachi Chemical Co., Ltd., Tg: 0 to 12° C., weight average molecular weight: 450000 to 650000)

(d) Filler

Resin Filler

Organic filler (EXL-2655, ROHM AND HAAS JAPAN K. K., core-shell type organic fine particle)

Inorganic Filler

Silica filler (SE2050, Admatechs Company Limited, average particle size: 0.5 µm)

Methacrylic-surface-treated nano silica filler (YA050C-SM, Admatechs Company Limited, average particle size: about 50 nm)

(e) Fluxing Agent

2-Methylglutaric acid (Sigma-Aldrich, Inc., melting point: about 77° C.)

Additive

3-Methacryloxypropyltrimethoxysilane (OFS6030, Dow Corning Toray Co., Ltd.)

3-2. Preparation of Thermosetting Resin Composition

Various raw materials were mixed at the blending ratio presented in Table 7 to prepare thermosetting resin compositions A and B. The specific preparation method is described below. A thermosetting resin, a filler, and, as necessary, a fluxing agent were added to methyl ethyl ketone such that the concentration of non-volatile content (solid content) became 60% by mass. Thereafter, beads (Φ1.0 mm and (Φ2.0 mm) were added in an amount equal to the mass of solid content to the mixed solution, and the mixture was stirred with a bead mill (manufactured by Fritsch Japan Co., Ltd., planetary pulverizing mill P-7) for 30 minutes. A polymer component was added to the mixed solution, and the mixture was stirred with a bead mill for 30 minutes. After stirring, a curing agent and, as necessary, an additive were added, the mixture was stirred, and the mixed solution was filtrated to remove the beads to thereby obtain a filtrate as a thermosetting resin composition A or B.

TABLE 7

| Raw material (parts by mass) | | Thermosetting resin composition A | Thermosetting resin composition B |
|---|---|---|---|
| Thermosetting resin | EP1032H60 | 45 | — |
| | YL983U | 15 | — |
| | YL7175-1000 | 5 | — |
| | EA0200 | — | 65 |
| Curing agent | 2MAOK-PW | 6 | — |
| | PERCUMYL D | — | 1 |
| Polymer component | ZX1356-2 | 30 | — |
| | KH-C865 | — | 30 |
| Fluxing agent | 2-Methylglutaric acid | 4 | — |
| Filler | EXL-2655 | 10 | 10 |
| | SE2050 | 30 | 30 |
| | YA050C-SM | 45 | 85 |
| Additive | OFS6030 | — | 2 |

3-3. Preparation of Adhesive Film

The prepared thermosetting resin composition A or B was applied with a compact precision coating apparatus (Yasui Seiki Company, Ltd.) and dried in a clean oven (manufactured by ESPEC CORP.) (70° C./10 min) to obtain an adhesive film.

3-4. Manufacturing of Semiconductor Device

An adhesive film having a size of 8 mm×8 mm×0.045 mmt was bonded to a semiconductor chip (10 mm, 0.4 mm thick, metal of connection portion: Au, product name: WALTS-TEG IP80, manufactured by WALTS CO., LTD.). This semiconductor chip attached with the adhesion film was contacted to a semiconductor chip with solder bumps (chip size: 7.3 mm×7.3 mm×0.15 mmt, bump height: about 45 µm (total of copper pillar+solder), the number of bumps: 1048 pins, pitch of 80 µm, product name: WALTS-TEG CC80, manufactured by WALTS CO., LTD.) through the adhesion film, and the resultant product was temporarily press-bonded by FCB3 (manufactured by Panasonic Corporation, press-bonding head area: 7.3 mm×7.3 mm) to thereby prepare a laminate. The laminate using the thermosetting resin composition A was temporarily press-bonded by being heated and pressured at a pressure of 50 N for 3 seconds while the temperature of the press-bonding head of FCB3 was set to 130° C. The laminate using the thermosetting resin composition B was temporarily press-bonded by being heated and pressured at a pressure of 100 N for 3 seconds while the temperature of the press-bonding head of FCB3 was set to 130° C. Nine laminates that were temporarily press-bonded were prepared and the nine laminates were placed on a stage of a collective connection apparatus (manufactured by ALPHA DESIGN CO., LTD., HTB-MM) in which the area of the press-bonding head is 100 mm×100 mm. After placement, the laminates were covered with a sheet for collective connection (100 mm×100 mm) and was mainly press-bonded collectively to thereby obtain semiconductor devices. The main press-bonding was performed by performing heating and pressuring at a pressure of 900 N (100 N per laminate) for 5 seconds while the temperature of the stage was set to 80° C. and the temperature of the press-bonding head was set to 250° C.

3-5. Evaluation

Storage Elastic Modulus at 250° C. of Sheet for Collective Connection

The viscoelasticity of a test piece cut from the sheet for collective connection and having a width of 4 mm and a length of 40 mm was measured by using an elastic modulus measurement apparatus RSA2 (Rheometric Scientific, Inc.) while the temperature was increased from −30° C. to 300° C. under the conditions including a frequency of 10 Hz and a temperature increasing rate of 5° C./min. The storage elastic modulus at 250° C. was obtained from the measurement result.

Measurement of Displacement at 250° C. of Sheet for Collective Connection

The displacement at 250° C. of the sheet for collective connection was measured by using an electromechanical universal testing machine (manufactured by INSTRON, 5900 series) and Bluehill 3 software. A compression test was conducted in such a manner that the sheet for collective connection is placed in an chamber set to 250° C., a rod-shaped pressing jig having a cylindrical end face with a diameter of 8 µm was used, and the jig was pressed in a direction in which the principal surface of the sheet for collective connection and the end face of the jig are parallel to each other. A load of 100 N (about 2 MPa) was applied at a speed of 0.001 mm/sec to the sheet for collective connection by the pressing jig. The displacement at the time point when the load is stabilized to 100 N after 5 seconds from the time point when the compressive load becomes 100 N from 0 N was recorded as the displacement of the film thickness of the sheet for collective connection.

Evaluation of Connection

Whether or not the semiconductor device is initially conducted was measured by using a multimeter (manufactured by ADVANTEST CORPORATION, R6871E) after the main press-bonding. A semiconductor device in which the initial connection resistance value of the inner circumference of the peripheral portion is 40Ω or less and the initial connection resistance value of the outer circumference is 85Ω or less was regarded as "OK," and a semiconductor device in which the resistance value is more than the above values or which is not connected was regarded as "NG." A case where the number of semiconductor devices evaluated as "OK" among nine semiconductor devices is nine, that is, all semiconductor devices are evaluated as "OK" was determined "A" for comprehensive evaluation and a case other than the above case are evaluated as "B."

The results of collectively manufacturing semiconductor devices by using the thermosetting resin composition A and various sheets for collective connection are presented in Table 8.

TABLE 8

| Item | Ref. Ex. 3-1 | Ex. 3-1 | Ref. Ex. 3-2 | Ex. 3-2 | Ref. Ex. 3-3 |
|---|---|---|---|---|---|
| Thermosetting resin composition | A | A | A | A | A |
| Sheet for collective connection Type | NITOFLON 900 UL | NITOFLON 900 UL | UPILEX SGA | UPILEX SGA | Aluminum foil |
| Sheet for collective connection Thickness | 50 | 100 | 50 | 100 | 100 |
| Storage elastic modulus at 250° C. (GPa) | 0.07 | 0.07 | 6 | 6 | 39 |
| Displacement at 250° C. (μm) | 38 | 44 | 38 | 42 | 35 |
| Connection evaluation | B (2/9 OK) | A | B (2/9 OK) | A | B (1/9 OK) |

The results of collectively manufacturing semiconductor devices by using the thermosetting resin composition B and various sheets for collective connection are presented in Table 9.

TABLE 9

| Item | Ref. Ex. 3-4 | Ex. 3-3 | Ref. Ex. 3-5 | Ex. 3-4 | Ref. Ex. 3-6 |
|---|---|---|---|---|---|
| Thermosetting resin composition | B | B | B | B | B |
| Sheet for collective connection Type | NITOFLON 900 UL | NITOFLON 900 UL | UPILEX SGA | UPILEX SGA | Aluminum foil |
| Sheet for collective connection Thickness | 50 | 100 | 50 | 100 | 100 |
| Storage elastic modulus at 250° C. (GPa) | 0.07 | 0.07 | 6 | 6 | 39 |
| Displacement at 250° C. (μm) | 38 | 44 | 38 | 42 | 35 |
| Connection evaluation | B (4/9 OK) | A | B (5/9 OK) | A | B (2/9 OK) |

From the results of Tables 8 and 9, it was confirmed that in a case where the plurality of semiconductor chips and the plurality of other semiconductor chips are mainly press-bonded collectively, by using the sheet for collective connection having a storage elastic modulus at 250° C. of 10 GPa or less and a displacement at 250° C. of 40 μm or more, a semiconductor device with favorable connection can be more efficiently manufactured.

4. Examination Example Mainly Related to Third Embodiment 4-1. Preparation of Adhesive Film Compounds used in preparation of an adhesive film are described below.

(a) Thermosetting Resin
Acrylic Resin
Ethoxylated isocyanuric acid triacrylate (manufactured by Shin Nakamura Chemical Co., Ltd., A-9300, the number of functional groups of acryloyl group: 3)
Acrylate compound having a skeleton derived from fluorene (manufactured by Osaka Gas Chemicals Co., Ltd., EA0200, the number of functional groups of acryloyl group: 2)

(b) Curing Agent
Dicumyl peroxide (manufactured by NOF CORPORATION, PERCUMYL D)

(c) Polymer Component
Phenoxy resin (manufactured by TOHTO Chemical Industry Co., Ltd., ZX1356, Tg: about 71° C., weight average molecular weight: about 63000)
Acrylic rubber (manufactured by Hitachi Chemical Company, Ltd., KH-C865, Tg: 0 to 12° C., weight average molecular weight: 450000 to 650000)

(d) Filler
Inorganic Filler
Silica filler (manufactured by Admatechs Company Limited, SE2050, average particle size: 0.5 μm)
Silica filler surface-treated with epoxysilane (manufactured by Admatechs Company Limited, SE2050SEJ, average particle size: 0.5 μm)
Methacrylic-surface-treated nano silica filler (manufactured by Admatechs Company Limited, YA050CSM hereinafter, referred to as "SM nano silica," average particle size: about 50 nm)
Resin Filler
Organic filler (manufactured by ROHM AND HAAS JAPAN K. K., EXL-2655: core-shell type organic fine particle)

Production Example 4-1

An acrylic resin (A9300), an inorganic filler (SE2050, SE2050SEJ, and SM nano silica), and a resin filler (EXL2655) at the blended amounts presented in Table 1 (unit: part by mass) were added to methyl ethyl ketone as a solvent such that the concentration of non-volatile content (solid content, components other than the solvent) became 60% by mass. Then, beads (Φ1.0 mm and Φ2.0 mm) were added in an amount equal to the total amount of the acrylic resin and the inorganic filler that were added to methyl ethyl ketone, and the mixture was stirred with a bead mill (manufactured by Fritsch Japan Co., Ltd., planetary pulverizing mill P-7) for 30 minutes. Thereafter, a phenoxy resin (ZX1356) was added as a polymer component, and the mixture was stirred again with the bead mill for 30 minutes. After stirring, a curing agent (PERCUMYL D) was added, the mixture was stirred, and the beads were removed by filtration to obtain varnish. The obtained varnish was applied with a compact precision coating apparatus (manufactured by Yasui Seiki Company, Ltd.) and the coating film was dried in a clean oven (manufactured by ESPEC CORP.) (70° C./10 min) to obtain an adhesive film.

Production Example 4-2

An adhesive film was obtained in the same manner as in Production Example 4-1, except that the used materials were changed as presented in Table 10.

TABLE 10

| Raw material | | | Production Example 4-1 | Production Example 4-2 |
|---|---|---|---|---|
| Thermosetting resin | Acrylic resin | A9300 | 60 | — |
| | | EA0200 | — | 60 |
| | Curing agent | PERCUMYL D | 2 | 2 |
| | Polymer component | ZX1356 | 60 | — |
| | | KH-C865 | — | 30 |
| Filler | Inorganic filler | SE2050 | 15 | 15 |
| | | SE2050SEJ | 15 | 15 |
| | | SM nano silica | 80 | 80 |
| | Resin filler | EXL-2655 | 10 | 10 |

4-2. Manufacturing of Semiconductor Device

Example 4-1

The adhesive film produced in Production Example 4-1 was cut into a size of 8 mm×8 mm×0.045 mmt and was bonded onto a semiconductor chip (chip size: 10 mm×10 mm×0.4 mmt, metal of connection portion: Au, product name: WALTS-TEG IP80, manufactured by WALTS CO., LTD.). Subsequently, the semiconductor chip attached with the adhesive film was fed onto a stage of a pressing member prepared as the pressing member for temporary press-bonding. The semiconductor chip on the stage and a semiconductor chip with solder bumps (chip size: 7.3 mm×7.3 mm×0.15 mmt, metal of connection portion: copper pillar+ solder, bump height: about 45 μm (total of copper pillar+ solder), the number of bumps: 1048 pins, pitch of 80 μm, product name: WALTS-TEG CC80, manufactured by WALTS CO., LTD.) were aligned such that the respective connection portions faced to each other. Thereafter, a laminate including the semiconductor chip, the adhesive film, and the semiconductor chip was interposed between the press-bonding head and the stage and then pressured and heated to thereby temporarily press-bond the semiconductor chips to each other.

Subsequently, the obtained laminate was conveyed to a reflow furnace and heated for 600 seconds while the highest temperature is set to 260° C. to electrically connect the chip and the chip. A plurality of laminates were formed in the temporary press-bonding step and collectively conveyed to the reflow furnace to manufacture a plurality of semiconductor devices at once.

In the manufacturing of the semiconductor device, the condition is set such that the following evaluation of connection becomes A. The results of the manufacturing time required for each of the temporary press-bonding step and the heating step per one semiconductor device package (PKG), and the manufacturing time per 100 semiconductor device packages (PKG) are presented in Table 11.

Temporary Press-Bonding Condition

Temperature of press-bonding head: 80° C., load: 75 N, stage temperature: 80° C.

4-3. Evaluation

Evaluation of Connection

The connection resistance value of the prepared semiconductor device was measured with a multimeter (manufactured by ADVANTEST CORPORATION, trade name "R6871E") to evaluate initial conduction after packaging. A case where the initial connection resistance value of the inner circumference of the peripheral portion is 45Ω or less and the initial connection resistance value of the outer circumference is 85Ω or less was regarded as "A," and all of a case where the initial connection resistance value of the inner circumference is more than 45Ω, a case where the initial connection resistance value of the outer circumference is more than 85Ω, and a case where conduction does not occur (resistance value not indicated) were regarded as "B."

Comparative Example 4-1

A semiconductor device was manufactured in the same manner as in Example 4-1, except that the condition was changed in the following point. The semiconductor chip and a semiconductor chip with bumps were aligned on a stage of a pressing member. Thereafter, while pressuring was performed by the press-bonding head and the stage of the pressing member, the temperature of the press-bonding head was increased to 280° C. for 1 second and then this state was held for 2 seconds. Accordingly, the semiconductor chip and the semiconductor chip with bumps were press-bonded and electrically connected. The total time for press-bonding was 3 seconds. Thereafter, the temperature of the press-bonding head was cooled from 280° C. to 80° C. of the feed temperature of the semiconductor chip. A plurality of semiconductor devices were manufactured by using the pressing member. In the manufacturing of the semiconductor device, the condition was set such that the evaluation of connection became "A." The results of the manufacturing time required for each stage of the press-bonding step and the manufacturing time per 100 semiconductor device packages (PKG) are presented in Table 11.

TABLE 11

| | | Example 4-1 | | Comparative Example 4-1 | |
|---|---|---|---|---|---|
| | Item | | Manufacturing time [s] | Item | Manufacturing time [s] |
| Pressing member (per 1 PKG) | Feeding semiconductor chip to pressing member → Alignment → Temporary press-bonding | | 3 | Feeding semiconductor chip to pressing member → Alignment Press-bonding Cooling pressing member | 2<br><br><br><br><br>3<br>15 |
| | Total | | 3 | Total | 20 |

TABLE 11-continued

| | | Example 4-1 | | Comparative Example 4-1 | |
|---|---|---|---|---|---|
| | Item | | Manufacturing time [s] | Item | Manufacturing time [s] |
| Heating apparatus (per 100 PKG) | Heating laminate | | 600 | | |
| | Total | | 600 | | |
| Manufacturing time [s] per 100 PKG | | | 900 | | 2000 |

Example 4-2

A semiconductor device was manufactured in the same manner as in Example 4-1, except that an oven was used as the heating apparatus instead of a reflow furnace and the laminate was heated in the oven set to 260° C. for 600 seconds. The results are presented in Table 12.

TABLE 12

| | | Example 4-2 |
|---|---|---|
| | Item | Manufacturing time [s] |
| Pressing member (per 1 PKG) | Feeding semiconductor chip to pressing member → Alignment → Temporary press-bonding | 3 |
| | Total | 3 |
| Heating apparatus (per 100 PKG) | Heating laminate | 600 |
| | Total | 600 |
| Manufacturing time [s] per 100 PKG | | 900 |

Example 4-3

A semiconductor device was manufactured in the same manner as in Example 4-1, except that the adhesive film of Production Example 4-2 was used. The results are presented in Table 13.

Comparative Example 4-2

A semiconductor device was manufactured in the same manner as in Comparative Example 4-1, except that the adhesive film of Production Example 4-2 was used. The results are presented in Table 13.

TABLE 13

| | Example 4-3 | | Comparative Example 4-2 | |
|---|---|---|---|---|
| | Item | Manufacturing time [s] | Item | Manufacturing time [s] |
| Pressing member (per 1 PKG) | Feeding semiconductor chip to pressing member → Alignment → Temporary press-bonding | 3 | Feeding semiconductor chip to pressing member → Alignment Press-bonding Cooling pressing member | 2<br>3<br>15 |
| | Total | 3 | Total | 20 |
| Heating apparatus (per 100 PKG) | Heating laminate | 600 | | |
| | Total | 600 | | |
| Manufacturing time [s] per 100 PKG | | 900 | | 2000 |

Example 4-4

A semiconductor device was manufactured in the same manner as in Example 4-3, except that an oven was used as the heating apparatus instead of a reflow furnace and the laminate was heated in the oven set to 260° C. for 600 seconds. The results are presented in Table 14.

TABLE 14

| | | Example 4-4 |
|---|---|---|
| | Item | Manufacturing time [s] |
| Pressing member (per 1 PKG) | Feeding semiconductor chip to pressing member → Alignment → Temporary press-bonding | 3 |
| | Total | 3 |
| Heating apparatus (per 100 PKG) | Heating laminate | 600 |
| | Total | 600 |
| Manufacturing time [s] per 100 PKG | | 900 |

As clearly seen from the results of Tables 11 to 14, according to the method for manufacturing a semiconductor device related to the present embodiment, it is possible to shorten the manufacturing time of the semiconductor device.

5. Examination Example Mainly Related to Third Embodiment
5-1. Raw Material
Compounds used in Examples are described below.
(i) Resin Component Having Weight Average Molecular Weight of Less than 10000
Epoxy Resin
Polyfunctional solid epoxy resin having a triphenol methane skeleton (Japan Epoxy Resin Co., Ltd., EP1032H60, hereinafter, referred to as "EP1032"), weight average molecular weight: 800 to 2000

Bisphenol F type liquid epoxy resin (Japan Epoxy Resin Co., Ltd., YL983U, hereinafter, referred to as "YL983"), weight average molecular weight: about 336

Flexible semisolid epoxy (Japan Epoxy Resin Co., Ltd., YL7175-1000, hereinafter, referred to as "YL7175"), weight average molecular weight: 1000 to 5000
(ii) Curing Agent
2,4-Diamino-6-[2'-methylimidazolyl-(1)]-ethyl-s-triazine isocyanuric acid adduct (manufactured by SHIKOKU CHEMICALS CORPORATION, 2MAOK-PW, hereinafter, referred to as "2MAOK")
(iii) Polymer Component Having Weight Average Molecular Weight of 10000 or More
Phenoxy resin (TOHTO Chemical Industry Co., Ltd., ZX1356-2, Tg: about 71° C., Mw: about 63000, hereinafter, referred to as "ZX1356")
(iv) Fluxing Agent (Carboxylic Acid)
2-Methylglutaric acid (Sigma-Aldrich, Inc., melting point: about 77° C., hereinafter, referred to as "glutaric acid")
(v) Filler
Inorganic Filler
Silica filler (Admatechs Company Limited, SE2050, average particle size: 0.5 μm)
Phenyl-surface-treated nano silica filler (Admatechs Company Limited, YA050C-SP, hereinafter, referred to as SP nano silica, average particle size: about 50 nm)
Resin Filler
Organic filler (ROHM AND HAAS JAPAN K. K., EXL-2655: core-shell type organic fine particle)
(vi) Silicone Resin
A silicone resin having a basic structure represented by the following chemical formula was prepared.

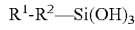
$R^1\text{-}R^2\text{—}Si(OH)_3$

Silanol Compound
Solid silanol, $R^1$: phenyl group or propyl group, $R^2$: alkylene group, X: H (manufactured by Dow Corning Toray Co., Ltd., RSN-6018, molecular weight: about 2000)
Solid silanol, $R^1$: phenyl group, $R^2$: alkylene group, X: H (manufactured by Dow Corning Toray Co., Ltd., FCA107, molecular weight: about 3000)
Other Silicone Resins
Liquid silicone resin, $R^1$: methyl group, R2: alkylene group, X: $CH_3$ (manufactured by Dow Corning Toray Co., Ltd., SR2402, molecular weight: about 1500)
5-2. Preparation of Film Adhesive

Example 5-1

An organic solvent (methyl ethyl ketone) was added to an epoxy resin, 2MAOK, 2-methylglutaric acid, an inorganic filler, a resin filler, and silanol such that the non-volatile content (NV) became 60% by mass. Thereafter, beads (0.0 mm and 412.0 mm) were added in an amount equal to the mass of solid content thereto, and the mixture was stirred with a bead mill (manufactured by Fritsch Japan Co., Ltd., planetary pulverizing mill P-7) for 30 minutes. Thereafter, ZX1356 was added thereto, and the mixture was stirred again with the bead mill for 30 minutes. The beads used in stirring were removed by filtration. The prepared varnish (adhesive for a semiconductor) was applied with a compact precision coating apparatus (manufactured by Yasui Seiki Company, Ltd.) and the coating film was dried in a clean oven (manufactured by ESPEC CORP.) (70° C./10 min) to obtain a film adhesive.

Examples 5-2 to 5-4 and Reference Examples 5-1 to 5-3

Film adhesives were prepared in the same manner as the preparation method of the film adhesive of Example 5-1, except that the used materials were changed as presented in Table 15. In Table 15, the amount of each material blended is the amount of non-volatile content blended and the unit thereof is part(s) by mass.

5-3. Evaluation (1) Evaluation of Thermal Weight Loss Amount

Into a Pt pan, about 10 mg of a silicone resin simple substance was put, and the thermal weight loss from 35° C. to 400° C. was measured with a TG/DTA measurement apparatus (manufactured by Seiko Instruments Inc., EXSTAR6000). The temperature increasing rate was set to 10° C./min. A sample in which the thermal weight loss amount at 260° C. is 20% or less was evaluated as "A" and a sample in which the thermal weight loss amount at 260° C. is more than 20% was evaluated as "B."

(2) Measurement of Viscosity

A rheometer MCR301 (manufactured by Anton Paar Japan K.K.) was used. An adhesive for a semiconductor was fed onto a stage, and a measurement jig was installed without voids entering. The measurement conditions were set as follows: interval between the stage and the measurement jig (φ8 mm): 0.3 mm, oscillation angle gamma=5%, frequency f=1 Hz, normal force FN=0 μN, temperature increasing rate: 10° C./min, and measurement range: 30° C. to 180° C. The viscosity at 130° C. (the temperature of the first step in the following (3)) was obtained from the viscosity curve.

(3) Manufacturing of Semiconductor Device (Evaluation of Connection)

The produced film adhesive was cut into a size of 7.3 mm×7.3 mm×0.045 mmt, bonded onto a semiconductor chip with solder bumps (chip size: 7.3 mm×7.3 mm×0.15 mmt, bump height: about 45 μm (total of copper pillar+solder), the number of bumps: 1048, pitch of 80 μm, WALTS-TEG CC80 Model I, manufactured by WALTS CO., LTD.), and then temporarily press-bonded to the receiving-side semiconductor chip (chip size: 10 mm×10 mm×0.1 mmt, WALTS-TEG IP80, manufactured by WALTS CO., LTD.) by FCB3 (manufactured by Panasonic Corporation). The stage temperature was set to 80° C. The semiconductor chips were aligned at 130° C./100 N/3 s and temporarily press-bonded (first step). The temporarily press-bonded laminate was mainly press-bonded by being allowed to pass through a reflow furnace (manufactured by TAMURA CORPORATION) which reached the highest temperature of 260° C. for about 600 s (10 min) to obtain a sample of a semiconductor device package. Whether or not the semiconductor device is initially conducted was measured by using a multimeter (manufactured by ADVANTEST CORPORATION, R6871E) respectively after the first step and after the second step. A sample in which the connection resistance value of the peripheral portion (inner circumference portion) is 32.0 to 38.0Ω was evaluated as "A (favorable connection)" and a sample in which the connection resistance value is a value other than the above range or which is in an "Open" state was evaluated as "B (failed connection)."

(4) Evaluation of Voids

An image of the appearance of each sample prepared in the above (3) after the first step and after the second step was taken with an ultrasonic image diagnostic apparatus (Insight-300, manufactured by Insight k.k.) and an image of the layer formed from the adhesive for a semiconductor (adhesive layer) on the chip was taken with a scanner GT-9300UF (manufactured by Seiko Epson Corporation). The image was subjected to color tone correction and black and white conversion with an image processing software Adobe Photoshop to distinguish void portions, and the proportion of the void portions was calculated based on a histogram. The area of the adhesive portion for the semiconductor on the chip was regarded as 100%. A case where the void generation rate is 5% or less was evaluated as "A," and a case where the void generation rate is more than 5% was evaluated as "B."

(5) Evaluation of Reflow Resistance

The package prepared in the above (3) was molded using a sealing material (manufactured by Hitachi Chemical Co., Ltd., CEL9750ZHF10) (condition: 180° C./6.75 MPa/90 s). Then, the molded product was after-cured in a clean oven (manufactured by ESPEC CORP.) at 175° C. for 5 hours. Thereafter, the package was allowed to absorb moisture at a high temperature under a JEDEC level 2, and then the reflow evaluation (reflow furnace: manufactured by TAMURA CORPORATION) was performed. After reflow, a sample without peel-off and with favorable connection was regarded as "A" and a sample in which peel-off or failed connection occurs was regarded as "B." The connection evaluation method was performed by the same method as in the above (3).

TABLE 15

| | | Example | | | | Ref. Example | | |
|---|---|---|---|---|---|---|---|---|
| Raw material | | 5-1 | 5-2 | 5-3 | 5-4 | 5-1 | 5-2 | 5-3 |
| Silicone resin | SR2402 | — | — | — | — | — | 5 | 10 |
| | RSN6018 | 5 | — | 10 | — | — | — | — |
| | FCA107 | — | 5 | — | 10 | — | — | — |
| Resin component having a molecular weight of less than 10000 | EP1032 | 45 | 45 | 45 | 45 | 45 | 45 | 45 |
| | YL983 | 15 | 15 | 15 | 15 | 15 | 15 | 15 |
| | YL7175 | 5 | 5 | 5 | 5 | 5 | 5 | 5 |
| Curing agent | 2MAOK | 6 | 6 | 6 | 6 | 6 | 6 | 6 |
| Polymer component having a molecular weight of 10000 or more | ZX1356 | 30 | 30 | 30 | 30 | 30 | 30 | 30 |
| Fluxing agent | Glutaric acid | 4 | 4 | 4 | 4 | 4 | 4 | 4 |
| Resin filler | EXL2655 | 10 | 10 | 10 | 10 | 10 | 10 | 10 |
| Inorganic filler | SE2050 | 30 | 30 | 30 | 30 | 30 | 30 | 30 |

TABLE 15-continued

| Raw material | Example 5-1 | Example 5-2 | Example 5-3 | Example 5-4 | Ref. Example 5-1 | Ref. Example 5-2 | Ref. Example 5-3 |
|---|---|---|---|---|---|---|---|
| SP nano silica | 45 | 45 | 45 | 45 | 45 | 45 | 45 |
| Evaluation result | | | | | | | |
| Thermal weight loss amount evaluation | A | A | A | A | — | B | B |
| Viscosity (Pa · s) | 4800 | 4500 | 4400 | 4200 | 6000 | 4500 | 4300 |
| Connection evaluation after first step | A | A | A | A | A | A | A |
| Void evaluation after first step | A | A | A | A | B | B | B |
| Connection evaluation after second step | A | A | A | A | B | A | A |
| Void evaluation after second step | A | A | A | A | B | B | B |
| Reflow resistance evaluation | A | A | A | A | B | B | B |

It was confirmed that the adhesive for a semiconductor of each of Examples 5-1 to 5-4 to which solid silanol represented by General Formula (1) is added is made voidless both after the first step and after the second step, in which connection can be secured and the reflow resistance is also satisfied.

As described above, according to the method for continuously manufacturing a semiconductor device while the pressing member for main press-bonding is maintained at a high temperature, generation of voids can be sufficiently suppressed and thus a semiconductor device with excellent connection reliability can be obtained. Further, when a plurality of semiconductor chips and a plurality of substrates and/or a plurality of semiconductor chips are mainly press-bonded collectively, semiconductor devices having favorable connection can be obtained.

REFERENCE SIGNS LIST

1: semiconductor chip, 2: substrate, 3: laminate, 5: interposer, 10: semiconductor chip main body, 15, 16: circuit, 20: substrate main body, 30, 32, 33: bump, 34: penetrating electrode, 40: adhesive layer, 41, 44: press-bonding head, 42, 45: stage, 43: pressing device for temporary press-bonding, 46: pressing device for main press-bonding, 50: interposer main body, 70: solder resist, 100, 200, 300, 400, 500, 600: semiconductor device.

The invention claimed is:

1. A method for manufacturing a semiconductor device including a semiconductor chip, at least a substrate or another semiconductor chip, and an adhesive layer interposed between the semiconductor chip and the substrate or between the semiconductor chip and the another semiconductor chip, the semiconductor chip and the substrate or the another semiconductor chip each having a connection portion having a surface formed by a metal material, the connection portion of the semiconductor chip and the connection portion of the substrate or the another semiconductor chip being electrically connected by metal bonding, the method sequentially comprising the following steps of:

heating and pressuring a laminate having: the semiconductor chip; the substrate, the another semiconductor chip or a semiconductor wafer including a portion corresponding to the another semiconductor chip; and the adhesive layer disposed therebetween, the connection portion of the semiconductor chip and the connection portion of the substrate or the another semiconductor chip being disposed to face each other, by interposing the laminate with a pair of facing pressing members for temporary press-bonding to thereby temporarily press-bond the substrate and the another semiconductor chip or the semiconductor wafer to the semiconductor chip; and heating and pressuring the laminate by interposing the laminate with a pair of facing pressing members for main press-bonding, which is separately prepared from the pressing members for temporary press-bonding, to thereby electrically connect the connection portion of the semiconductor chip and the connection portion of the substrate or the another semiconductor chip by metal bonding, wherein at least one of the pair of pressing members for temporary press-bonding is heated to a temperature lower than a melting point of the metal material forming the surface of the connection portion of the semiconductor chip and a melting point of the metal material forming the surface of the connection portion of the substrate or the another semiconductor chip when the laminate is heated and pressured, at least one of the pair of pressing members for main press-bonding is heated to a temperature equal to or higher than at least one melting point of a melting point of the metal material forming the surface of the connection portion of the semiconductor chip, or a melting point of the metal material forming the surface of the connection portion of the substrate or the another semiconductor chip when the laminate is heated and pressured, a plurality of semiconductor devices are continuously manufactured while maintaining a state in which at least one of the pair of pressing members for main press-bonding is heated to a temperature equal to or higher than at least one melting point of a melting point of the metal material forming the surface of the connection portion of the semiconductor chip, or a melting point of the metal material forming the surface of the connection portion of the substrate or the another semiconductor chip, and a melt viscosity of the adhesive layer is 7000 Pa·s or less at a temperature to which the pressing member for temporary press-bonding is heated.

2. The method according to claim 1, wherein the adhesive layer is a layer comprising a thermosetting resin composition comprising a thermosetting resin having a molecular weight of 10000 or less and a curing agent therefor.

3. The method according to claim 2, wherein the thermosetting resin composition further comprises a polymer component having a weight average molecular weight of 10000 or more.

4. The method according to claim 3, wherein a weight average molecular weight of the polymer component is 30000 or more and a glass transition temperature of the polymer component is 100° C. or lower.

5. The method according to claim 1, wherein the adhesive layer is a layer formed by an adhesive film which is prepared in advance.

6. The method according to claim 1, wherein the connection portion of the semiconductor chip and the connection portion of the substrate or the another semiconductor chip are contacted to each other and the substrate or the another semiconductor chip is temporarily press-bonded to the semiconductor chip.

7. A method for manufacturing a semiconductor device including a semiconductor chip, at least a substrate or another semiconductor chip, and an adhesive layer interposed between the semiconductor chip and the substrate or between the chip and the another semiconductor chip, the semiconductor chip and the substrate or the another semiconductor chip each having a connection portion having a surface formed by a metal material, the connection portion of the semiconductor chip and the connection portion of the substrate or the another semiconductor chip being electrically connected by metal bonding, the method sequentially comprising the following steps of:

heating and pressuring a laminate having the semiconductor chip, the substrate, the another semiconductor chip or a semiconductor wafer including a portion corresponding to the another semiconductor chip, and the adhesive layer disposed therebetween, the connection portion of the semiconductor chip and the connection portion of the substrate or the another semiconductor chip being disposed to face each other, by interposing the laminate with a pair of facing pressing members for temporary press-bonding to thereby temporarily press-bond the substrate and the another semiconductor chip or the semiconductor wafer to the semiconductor chip; and electrically connecting the connection portion of the semiconductor chip and the connection portion of the substrate or the another semiconductor chip, wherein at least one of the pair of pressing members for temporary press-bonding is heated to a temperature lower than a melting point of the metal material forming the surface of the connection portion of the semiconductor chip and a melting point of the metal material forming the surface of the connection portion of the substrate or the another semiconductor chip when the laminate is heated and pressured, in the step of electrically connecting the connection portion of the semiconductor chip and the connection portion of the substrate or the another semiconductor chip, the laminate is heated in a heating furnace or on a hot plate to a temperature equal to or higher than at least one melting point of a melting point of the metal material forming the surface of the connection portion of the semiconductor chip, or a melting point of the metal material forming the surface of the connection portion of the substrate or the another semiconductor chip, and the adhesive layer is a layer containing the adhesive for a semiconductor comprising:
(a) a resin component having a weight average molecular weight of less than 10000;
(b) a curing agent; and
(c) a silanol compound represented by the following General Formula (1):

$$R^1\text{-}R^2\text{—}Si(OH)_3 \qquad (1)$$

in the formula, R1 represents an alkyl group or a phenyl group, and R2 represents an alkylene group.

8. The method according to claim 7, wherein a plurality of the laminates are collectively heated in the heating furnace or on the hot plate.

9. The method according to claim 7, wherein the adhesive layer is a layer comprising a thermosetting resin composition comprising a thermosetting resin having a molecular weight of 10000 or less and a curing agent therefor.

10. The method according to claim 7, wherein the adhesive layer is a layer formed by an adhesive film which is prepared in advance.

11. The method according to claim 7, wherein the connection portion of the semiconductor chip and the connection portion of the substrate or the another semiconductor chip are contacted to each other and the substrate or the another semiconductor chip is temporarily press-bonded to the semiconductor chip.

* * * * *